United States Patent
Kobayashi et al.

(10) Patent No.: US 10,091,449 B2
(45) Date of Patent: Oct. 2, 2018

(54) IMAGING DEVICE AND IMAGING SYSTEM CAPABLE OF PERFORMING A GLOBAL ELECTRONIC SHUTTER OPERATION

(71) Applicant: CANON KABUSHIKI KAISHA, Tokyo (JP)

(72) Inventors: Masahiro Kobayashi, Tokyo (JP); Takeshi Ichikawa, Hachioji (JP); Yusuke Onuki, Fujisawa (JP); Masaaki Minowa, Kawasaki (JP); Kazunari Kawabata, Kawasaki (JP); Hiroshi Sekine, Kawagoe (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/254,853

(22) Filed: Sep. 1, 2016

(65) Prior Publication Data

US 2017/0078605 A1    Mar. 16, 2017

(30) Foreign Application Priority Data

Sep. 11, 2015  (JP) ................................ 2015-180064

(51) Int. Cl.
| | |
|---|---|
| *H04N 5/335* | (2011.01) |
| *H04N 5/378* | (2011.01) |
| *H04N 5/376* | (2011.01) |
| *H04N 5/232* | (2006.01) |

(52) U.S. Cl.
CPC ............. *H04N 5/378* (2013.01); *H04N 5/232* (2013.01); *H04N 5/3765* (2013.01)

(58) Field of Classification Search
CPC ..................................................... H04N 5/3765
See application file for complete search history.

(56) References Cited

U.S. PATENT DOCUMENTS

| 2013/0214128 A1* | 8/2013 | Yamashita | ........ H01L 27/14609 |
| | | | 250/208.1 |
| 2015/0256778 A1* | 9/2015 | Kusaka | .................. G03B 13/36 |
| | | | 348/302 |

FOREIGN PATENT DOCUMENTS

| JP | 2004-111590 A | 4/2004 |
| JP | 2006-246450 A | 9/2006 |
| JP | 2007-325139 A | 12/2007 |

* cited by examiner

*Primary Examiner* — Gary C Vieaux
(74) *Attorney, Agent, or Firm* — Canon U.S.A., Inc. IP Division

(57) ABSTRACT

The imaging device performs a global electronic shutter operation in which exposure periods of a plurality of pixels coincide with each other. In a first period during which a photoelectric conversion portion of at least one of the pixels accumulates an electric charge, signals based on electric charges held in holding portions of the plurality of pixels are sequentially output to an output line. During a second period after the output of the signals from the plurality of pixels is finished, the holding unit of each of the plurality of pixels holds an electric charge.

16 Claims, 21 Drawing Sheets

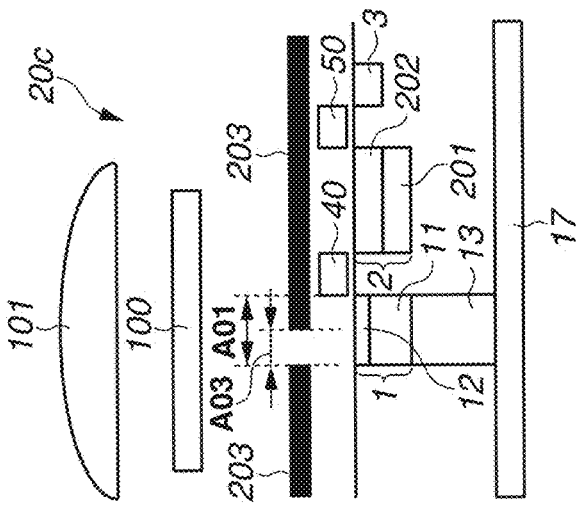
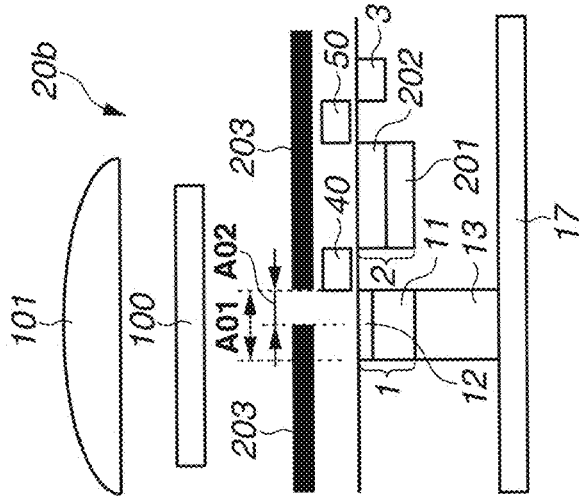
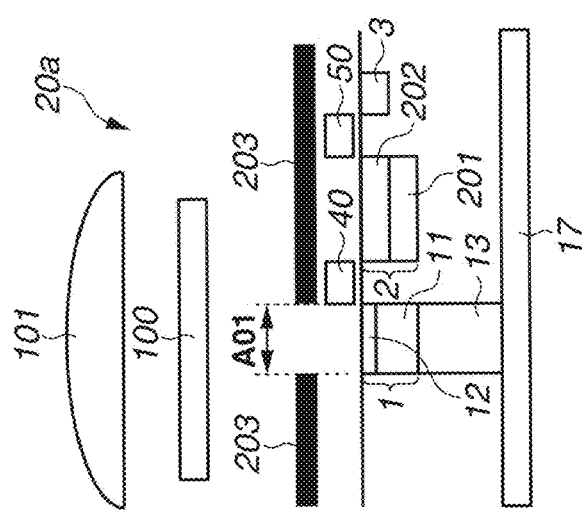

IMAGING DEVICE AND IMAGING SYSTEM CAPABLE OF PERFORMING A GLOBAL ELECTRONIC SHUTTER OPERATION

BACKGROUND

Technique Field

The present disclosure relates to an imaging device and an imaging system.

Description of the Related Art

In recent years, a method for using a global electronic shutter in a complementary metal-oxide-semiconductor (CMOS) image sensor is discussed. Each of imaging devices discussed in Japanese Patent Application Laid-Open No. 2004-111590 and Japanese Patent Application Laid-Open No. 2006-246450 has the advantage that even if a quickly moving object is captured, an object image is not distorted. Further, Japanese Patent Application Laid-Open No. 2007-325139 discusses an imaging device that performs focus detection by a pupil division phase difference method.

SUMMARY

According to a first aspect of the embodiment, an imaging device includes a plurality of pixels each including a photoelectric conversion portion configured to accumulate an electric charge generated with incident light, a holding unit configured to hold the electric charge, an amplification unit configured to output a signal based on the electric charge, a first transfer switch configured to transfer the electric charge from the photoelectric conversion portion to the holding unit, and a second transfer switch configured to transfer the electric charge from the holding unit to the amplification unit, and an output line to which signals from the amplification units of the plurality of pixels are output, wherein the photoelectric conversion portion of each of at least some pixels of the plurality of pixels includes a plurality of accumulation regions electrically isolated from each other, wherein at a first time, the photoelectric conversion portions of the plurality of pixels starts accumulating the electric charge, wherein from the first time to a second time, the first transfer switch of at least one pixel of the plurality of pixels is maintained in an off-state, and the photoelectric conversion portion of the at least one pixel accumulates an electric charge generated during a first period from the first time to the second time, wherein in the first period, the second transfer switches of the plurality of pixels are turned on in turns, and the amplification units of the plurality of pixels output signals in turns, wherein during at least a part of a second period from the second time to a third time, the holding unit of each of the plurality of pixels holds an electric charge generated during the first period in the photoelectric conversion portion and an electric charge generated during the second period in the photoelectric conversion portion, and wherein at the third time, the first transfer switches of the plurality of pixels are controlled to shift from an on-state to an off-state.

According to a second aspect of the present invention, an imaging device includes a plurality of pixels each including a photoelectric conversion portion configured to accumulate an electric charge generated by incident light, a holding unit configured to hold the electric charge, an amplification unit configured to output a signal based on the electric charge, a first transfer switch configured to transfer the electric charge from the photoelectric conversion portion to the holding unit, and a second transfer switch configured to transfer the electric charge from the holding unit to the amplification unit, an output line to which signals from the amplification units of the plurality of pixels are output, and light shielding portions configured to shield the photoelectric conversion portions of a pair of pixels included in the plurality of pixels from light so that the photoelectric conversion portions of the pair of pixels receive light passing through positions different from each other in a pupil, wherein at a first time, the photoelectric conversion portions of the plurality of pixels starts accumulating the electric charge, wherein from the first time to a second time, the first transfer switch of at least one pixel of the plurality of pixels is maintained in an off-state, and the photoelectric conversion portion of the at least one pixel accumulates an electric charge generated during a first period from the first time to the second time, wherein in the first period, the second transfer switches of the plurality of pixels are turned on in turns, and the amplification units of the plurality of pixels output signals in turns, wherein during at least a part of a second period from the second time to a third time, the holding unit of each of the plurality of pixels holds an electric charge generated during the first period in the photoelectric conversion portion and an electric charge generated during the second period in the photoelectric conversion portion, and wherein at the third time, the first transfer switches of the plurality of pixels are controlled to shift from an on-state to an off-state.

According to a third aspect of the present invention, an imaging device includes a plurality of pixels, each including a photoelectric conversion portion configured to accumulate an electric charge generated by incident light, a holding unit configured to hold the electric charge, an amplification unit configured to output a signal based on the electric charge, a first transfer switch configured to transfer the electric charge from the photoelectric conversion portion to the holding unit, and a second transfer switch configured to transfer the electric charge from the holding unit to the amplification unit; and an output line to which signals from the amplification units of the plurality of pixels are output, wherein at a first time, the photoelectric conversion portions of the plurality of pixels starts accumulating the electric charge, wherein from the first time to a second time, the first transfer switch of at least one pixel of the plurality of pixels is maintained in an off-state, and the photoelectric conversion portion of the at least one pixel accumulates an electric charge generated during a first period from the first time to the second time, wherein during the first period, the second transfer switches of the plurality of pixels are turned on in turns, and the amplification units of the plurality of pixels output signals in turns, wherein during at least a part of a second period from the second time to a third time, the holding unit of each of the plurality of pixels holds an electric charge generated during the first period in the photoelectric conversion portion and an electric charge generated during the second period in the photoelectric conversion portion, wherein at the third time, the first transfer switches of the plurality of pixels are controlled to shift from an on-state to an off-state, and wherein each of at least some pixels of the plurality of pixels outputs a signal for focus detection by an image plane phase difference method.

Further features of the present invention will become apparent from the following description of exemplary embodiments with reference to the attached drawings.

BRIEF DESCRIPTION OF THE DRAWINGS

FIGS. 2A, 2B, and 2C are diagrams each schematically illustrating a cross-sectional structure of a pixel of the imaging device.

DESCRIPTION OF THE EMBODIMENTS

Figure 1:
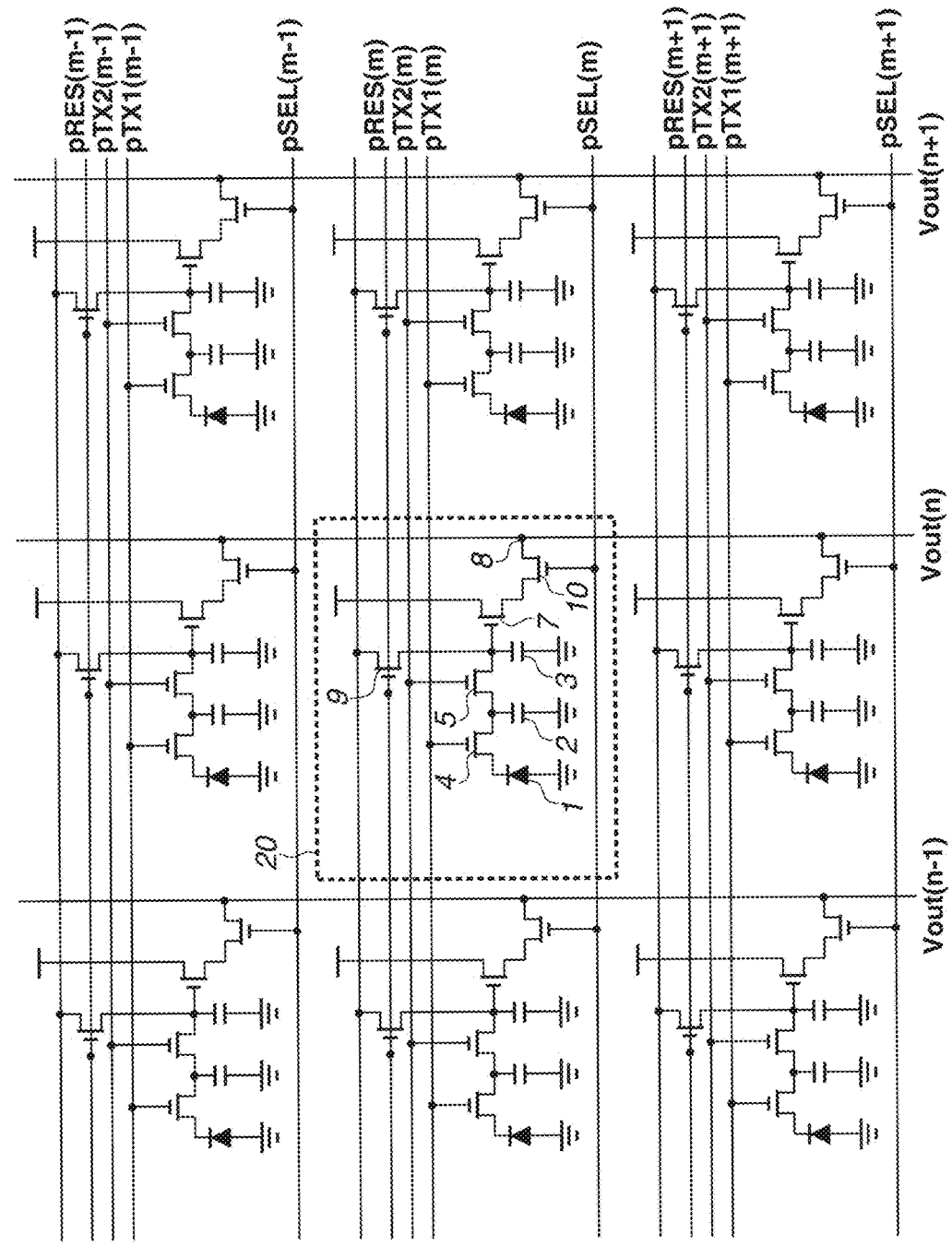
FIG. 1 is a diagram illustrating an equivalent circuit of pixels of an imaging device.

According to some embodiments, it is possible to improve the amount of saturation charge while performing a global electronic shutter operation. Further, it is possible to perform image plane phase difference autofocus on an imaging plane.

Each of the imaging device discussed in Japanese Patent Application Laid-Open No. 2004-111590 and the imaging device discussed in Japanese Patent Application Laid-Open No. 2007-325139 accumulates in a photoelectric conversion portion all electric charges generated through photoelectric conversion for obtaining a single image or a single frame. Then, the imaging device transfers the electric charges in all pixels from the photoelectric conversion portion to a holding unit simultaneously and starts photoelectric conversion for obtaining the next image or the next frame. Therefore, to increase the amount of saturation charge of a pixel, it is necessary to secure both the amount of saturation charge of the photoelectric conversion portion and the amount of saturation charge of the holding unit to be almost the same amount. If the amount of saturation charge of the photoelectric conversion portion is made large, the area of the photoelectric conversion portion increases. As a result, the size of the pixel becomes large.

The imaging device discussed in Japanese Patent Application Laid-Open No. 2006-246450 holds almost all electric charges in a holding unit by hardly accumulating an electric charge in a photoelectric conversion portion. Therefore, it is possible to increase the amount of saturation charge of a pixel without increasing the amount of saturation charge of the photoelectric conversion portion. In this method, however, a period during which a generated electric charge cannot be accumulated occurs. Therefore, the image quality may decrease.

As described above, with the imaging devices known to the inventors, it is difficult to make the amount of saturation charge of a pixel large. In view of the above problems, some embodiments enable improvement in the amount of saturation charge of a pixel in an imaging device capable of performing a global electronic shutter operation.

One embodiment according to the present invention is an imaging device including a plurality of pixels and an output line to which signals from the plurality of pixels are output. Each of the plurality of pixels includes a photoelectric conversion portion, a holding unit configured to hold an electric charge, and an amplification unit configured to output a signal based on the electric charge. Further, a first transfer switch configured to transfer the electric charge from the photoelectric conversion portion to the holding unit, and a second transfer switch configured to transfer the electric charge from the holding unit to the amplification unit are arranged. With such a configuration, it is possible to perform an imaging operation in which the periods of photoelectric conversion in a plurality of pixels coincide with each other, i.e., a so-called global electronic shutter operation. An electronic shutter operation refers to electrical control of the accumulation of an electric charge generated by incident light.

Further, at least some of the pixels output signals for focus detection by an image plane phase difference method. Thus, it is possible to perform a global electronic shutter operation and also achieve phase difference autofocus on an imaging plane. In some embodiments, the photoelectric conversion portion of each pixel includes a plurality of accumulation regions electrically isolated, or separated, from each other. With such a configuration, the pixel can output a signal for focus detection by the image plane phase difference method. Further, in some embodiments, light shielding portions configured to shield the photoelectric conversion portions included in a pair of pixels from light are provided to photoelectric conversion portion so that the photoelectric conversion portions of the pair of pixels receive light passing through positions different from each other in a pupil. With such a configuration, each of the pair of pixels can output a signal for focus detection by the image plane phase difference method.

In some embodiments according to the present invention, at a first time, the photoelectric conversion portions of the plurality of pixels simultaneously start accumulating electric charges. From the first time to a second time, the first transfer switch of at least one of the pixels is maintained in an off-state. In the at least one pixel, the photoelectric conversion portion accumulates an electric charge generated during this period. The period from the first time to the second time is a first period.

In the first period, signals based on electric charges held in the holding portions of the plurality of pixels are sequentially output from the amplification units to the output line. In other words, in the first period, each pixel outputs a signal at least once. As a specific operation, in the first period, the second transfer switches of the plurality of pixels are sequentially turned on. An electric charge generated during the first period is accumulated in the photoelectric conversion portion. Thus, during the first period, the holding unit can hold an electric charge generated before the first time.

The number of signals to be output in the first period can be changed depending on the format of an image to be output. For example, if a moving image is captured, as many signals as the number of horizontal lines used in a single frame may only need to be output. In such an embodiment, signals may not need to be output from all the pixels included in the imaging device.

After the output of the signals from the plurality of pixels is finished, during at least a part of a second period from the second time to a third time, the holding unit of each of the plurality of pixels holds an electric charge. At this time, the holding unit holds an electric charge generated during the first period and an electric charge generated during the second period. At the third time, the first transfer switches of the plurality of pixels are simultaneously controlled to shift from on-states to off-states.

The photoelectric conversion portion only needs to be able to accumulate at least an electric charge generated during the first period. Therefore, even if the amount of saturation charge of the photoelectric conversion portion is small, it is possible to maintain the amount of saturation charge of the pixel. Thus, with such a configuration, it is possible to perform a global electronic shutter operation while maintaining the amount of saturation charge. In some embodiments, the second period during which the holding unit of each of the plurality of pixels holds an electric charge is longer than the first period. This is because, since the second period is longer than the first period, it is possible to make the amount of saturation charge of the photoelectric conversion portion smaller.

With reference to the drawings, exemplary embodiments of the present invention will be described below. It is a matter of course that the exemplary embodiments according to the present invention are not limited only to the exemplary embodiments described below. For example, an example where the configuration of a part of any of the exemplary embodiments is added to another of the exemplary embodiments, or an example where the configuration of a part of any of the exemplary embodiments is replaced with the configuration of a part of another of the exemplary embodiments is also an exemplary embodiment of the present invention. Further, in the following exemplary embodiments, a first conductive type is an N-type, and a second conductive type is a P-type. Alternatively, the first conductive type may be a P-type, and the second conductive type may be an N-type.

Now, a first exemplary embodiment is described. FIG. 1 illustrates an equivalent circuit of pixels of an imaging device. Although FIG. 1 illustrates nine pixels 20, the imaging device includes more pixels.

Each pixel 20 includes a photoelectric conversion portion 1, a holding portion 2, an amplification unit 10, a first transfer switch 4, and a second transfer switch 5. Further, the pixel 20 includes a reset transistor 9 and a selection transistor 7.

The photoelectric conversion portion 1 accumulates an electric charge generated by incident light. The first transfer switch 4 transfers the electric charge in the photoelectric conversion portion 1 to the holding portion 2. The holding portion 2 holds, at a location different from that of the photoelectric conversion portion 1, the electric charge generated by incident light. The second transfer switch 5 transfers the electric charge in the holding portion 2 to an input node 3 of the amplification unit 10. The reset transistor 9 resets the voltage of the input node 3 of the amplification unit 10. The selection transistor 7 selects a pixel 20 from which a signal is to be output to the output line 8. The amplification unit 10 outputs a signal based on the electric charge generated by incident light to the output line 8. The amplification unit 10 includes, for example, an amplification transistor forming a source follower. Further, each of the first transfer switch 4 and the second transfer switch 5 is a metal-oxide-semiconductor (MOS) transistor.

To the first transfer switch 4, a control line Tx1 is connected. To the second transfer switch 5, a control line Tx2 is connected. In the present exemplary embodiment, a plurality of pixels is arranged in a matrix. To pixels included in a single row, a common control line is connected. In the present exemplary embodiment, a control line connected to pixels in an m-th row, for example, is referred to as a "control line Tx1(m)".

With such a configuration, the photoelectric conversion portion 1 can accumulate an electric charge generated while the holding portion 2 holds an electric charge. Therefore, it is possible to perform an imaging operation in which the periods of photoelectric conversion in a plurality of pixels coincide with each other, i.e., a so-called global electronic shutter operation.

FIGS. 2A, 2B, and 2C each schematically illustrate a cross-sectional structure of the imaging device. Each of FIGS. 2A, 2B, and 2C illustrates a cross section of a single pixel. For convenience, the pixel illustrated in FIG. 2A is referred to as a "pixel 20a". Similarly, the pixel illustrated in FIG. 2B is referred to as a "pixel 20b", and the pixel illustrated in FIG. 2C is referred to as a "pixel 20c". Portions having functions similar to those in FIG. 1 are denoted by the same numerals. FIGS. 2A, 2B, and 2C illustrate an imaging device of a front-side illumination type. Alternatively, an imaging device of a back-side illumination type may be used.

In FIGS. 2A to 2C, the photoelectric conversion portion 1 has a buried-type photodiode structure. The photoelectric conversion portion 1 includes an N-type semiconductor region 11 and a P-type semiconductor region 12. The N-type semiconductor region 11 and the P-type semiconductor region 12 form a P-N junction. The P-type semiconductor region 12 can suppress noise in an interface.

The P-type semiconductor region 12 is a well. Under the N-type semiconductor region 11, an N-type semiconductor region 13 is disposed. The impurity concentration of the N-type semiconductor region 13 is lower than the impurity concentration of the N-type semiconductor region 11. With this configuration, an electric charge generated at a deep position is collected in the N-type semiconductor regions. In this case, the N-type semiconductor region 13 may be of a P-type. Under the N-type semiconductor region 13, a P-type semiconductor region 17 is disposed, which serves as a potential barrier against an electric charge.

The holding portion 2 includes an N-type semiconductor region 201 and a P-type semiconductor region 202. An electric charge to be a signal is held in the N-type semiconductor region 201. The impurity concentration of the N-type semiconductor region 201 is higher than the impurity concentration of the N-type semiconductor region 11. The P-type semiconductor region 202 is disposed on the N-type semiconductor region 201. The P-type semiconductor region 202 can suppress noise in an interface.

A gate electrode 40 forms the gate of the first transfer switch 4. Further, a gate electrode 50 forms the gate of the second transfer switch 5. In some variations, a part of the gate electrode 40 is disposed on the N-type semiconductor region 201 via a gate insulating film. In this case, the P-type semiconductor region 202 is not disposed between the gate electrode 40 and the N-type semiconductor region 201. A negative voltage is applied to the gate electrode 40, whereby it is possible to induce holes on the surface of the N-type semiconductor region 201. Consequently, it is possible to suppress noise generated in an interface.

The holding portion 2 is shielded from light by a light shielding portion 203. The light shielding portion 203 is formed of a metal less likely to allow visible light to pass therethrough, such as tungsten or aluminum. On an aperture of the light shielding portion 203, a color filter 100 and a microlens 101 are disposed.

The pixel 20a illustrated in FIG. 2A does not output a signal for focus detection, and outputs a signal for imaging. The pixel 20b illustrated in FIG. 2B and the pixel 20c illustrated in FIG. 2C output signals for focus detection. An aperture A01 of the light shielding portion 203 of the pixel 20a illustrated in FIG. 2A is larger than an aperture A02 of the light shielding portion 203 of the pixel 20b illustrated in FIG. 2B. Further, the aperture A01 of the light shielding portion 203 of the pixel 20a illustrated in FIG. 2A is larger than an aperture A03 of the light shielding portion 203 of the pixel 20c illustrated in FIG. 2C. The aperture A02 of the light shielding portion 203 of the pixel 20b and the aperture A03 of the light shielding portion 203 of the pixel 20c are arranged so that the photoelectric conversion portions 1 of the pixels 20b and 20c receive light passing through positions different from each other in a pupil. For example, as illustrated in FIG. 2B, the aperture A02 of the light shielding portion 203 of the pixel 20b is shifted to the right side with respect to the center of the photoelectric conversion portion 1. Comparing the pixels 20a and 20b, the aperture A02 of the light shielding portion 203 of the pixel 20b corresponds to the right half of the aperture A01 of the light shielding portion 203 of the pixel 20a. Further, as illustrated in FIG. 2C, the aperture A03 of the light shielding portion 203 of the pixel 20c is shifted to the left side with respect to the center of the photoelectric conversion portion 1. Comparing the pixels 20a and 20c, the aperture A03 of the light shielding portion 203 of the pixel 20c corresponds to the left half of the aperture A01 of the light shielding portion 203 of the pixel 20a. With such a configuration, each of the pixels 20b and 20c can output a signal for focus detection. A pair of signals output from the pixels 20b and 20c is processed, whereby it is possible to perform focus detection by the image plane phase difference method.

In the present exemplary embodiment, in the light shielding portion 203, a portion disposed over the holding portion 2 and a portion disposed over the photoelectric conversion portion 1 are formed of a continuous metal layer.

The photoelectric conversion portion 1 and the holding portion 2 are disposed on a semiconductor substrate. In the present exemplary embodiment, the area of the orthogonal projection of the photoelectric conversion portion 1 on a plane parallel to the surface of the semiconductor substrate is smaller than the area of the orthogonal projection of the holding portion 2 on the plane. According to such a configuration, it is possible to obtain the effect that the amount of saturation charge of a pixel can be increased while noise is reduced.

Figure 3:
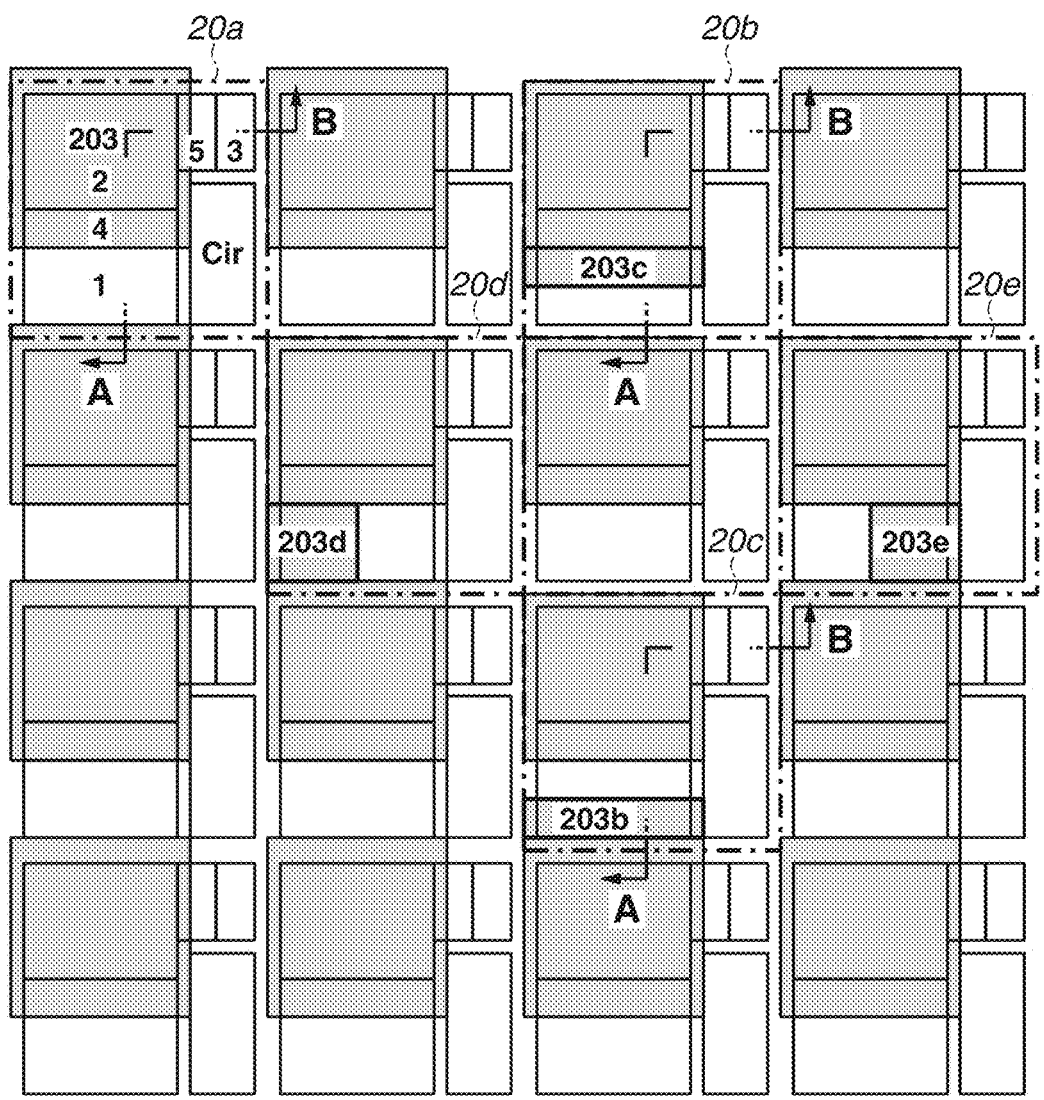
FIG. 3 is a diagram schematically illustrating an upper surface structure of pixels of the imaging device.

FIG. 3 schematically illustrates an upper surface structure of the imaging device. Portions having functions similar to those in FIGS. 1, 2A, 2B, and 2C are designated by the same numerals. The other members are disposed in a circuit region Cir. Further, FIGS. 2A, 2B, and 2C schematically illustrate cross sections of the pixels 20a, 20b, and 20c, respectively, taken along lines A-B.

FIG. 3 illustrates a top view of five pixels 20a to 20e. The five pixels are different in the shape of the light shielding portion 203. More specifically, the light shielding portions 203 of the pixels 20b to 20e include portions 203b to 203e, respectively, disposed on parts of the respective photoelectric conversion portions 1. The pixels 20b and 20c can form a pair of pixels of which upper and lower portions of the photoelectric conversion portions 1 are covered by the light shielding portions 203. With this combination, it is possible to detect the phase difference between the upper and lower portions. Further, the pixels 20d and 20e can form a pair of pixels of which left and right portions of the photoelectric conversion portions 1 are covered by the light shielding portions 203. With this combination, it is possible to detect the phase difference between the left and right portions.

The light shielding portions of pixels for focus detection may not necessarily need to be placed symmetrically in the up-down and left-right directions. Further, the ends of each aperture may not need to be placed in a central portion of the photoelectric conversion portion 1. For example, in pixels for focus detection at locations away from the center of the pixel region, the angles of incident light are different. Thus, it is also possible to appropriately change the proportion of the covering areas of upper, lower, left, and right light-shielding members according to a position in the pixel region.

Further, in FIG. 3, the additional light shielding portions of pixels for focus detection are shaped so as to be in contact with the upper, lower, left, and right light shielding portions. Alternatively, the additional light shielding portion may be formed of light-shielding members in layers different from those of the upper, lower, left, and right light shielding portions and shaped so that the light-shielding members overlap any one of the upper, lower, left, and right light shielding portions.

Further, upper, lower, left, and right pixels for focus detection may not necessarily need to be used as a set of four pixels. For example, the configuration may be such that according to the angle of incident light, only left and right pixels for focus detection are placed in the left-right direction of the pixel region, and only upper and lower pixels for focus detection are placed in the up-down direction of the pixel region.

To improve the amount of saturation charge of a pixel, it is desirable that the holding portion 2 should have a large amount of saturation charge. The impurity concentration of the N-type semiconductor region 201 of the holding portion 2 is made high, or the area of the N-type semiconductor region 201 in a plan view is made large, whereby it is possible to increase the amount of saturation charge of the holding portion 2. However, if the impurity concentration of the N-type semiconductor region 201 is high, a leakage current is likely to become large, and therefore, noise may become large. Thus, the area of the N-type semiconductor region 201 in a plan view is made large, whereby it is possible to restrain the impurity concentration of the N-type semiconductor region 201 while increasing the amount of saturation charge.

As described above, the area of the holding portion 2 in a plan view, i.e., the area of the orthogonal projection of the holding portion 2, is made large, whereby it is possible to increase the amount of saturation charge of the pixel while reducing noise. Consequently, the area of the photoelectric conversion portion 1 in a plan view is likely to be relatively small, and it is difficult to increase the amount of saturation charge of the photoelectric conversion portion 1. Thus, the effect becomes more prominent that even if the amount of saturation charge of the photoelectric conversion portion 1 is small, it is possible to maintain the amount of saturation charge of the pixel.

Figure 4:
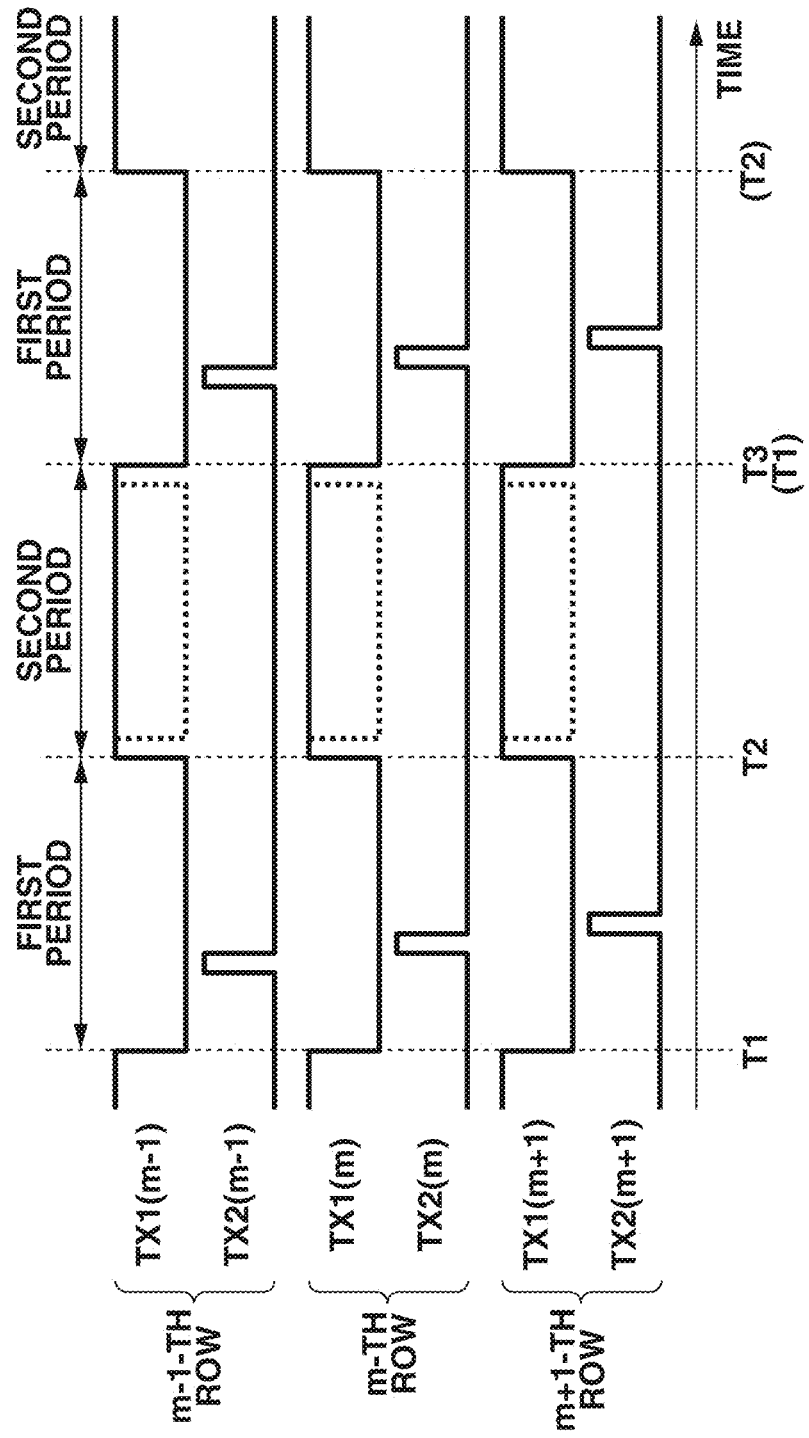
FIG. 4 is a diagram illustrating driving pulses of the imaging device.

A method for driving the imaging device according to the present exemplary embodiment is described. In this driving method, a pixel for outputting a signal for imaging and a pixel for outputting a signal for focus detection are driven in a similar manner, unless otherwise specified. FIG. 4 schematically illustrates driving pulses used in the present exemplary embodiment. FIG. 4 illustrates driving pulses supplied to the control line Tx1 of the first transfer switch 4 and the control line Tx2 of the second transfer switch 5 of each pixel in m−1-th to m+1-th rows. When a driving pulse is at a high level, the corresponding transistor or switch is turned on. When a driving pulse is at a low level, the corresponding transistor or switch is turned off. These driving pulses are supplied from a control unit disposed in the imaging device. As the control unit, a logic circuit such as a shift register or an address decoder is used.

First, before a time T1, an exposure in the previous frame is made. The exposure means that an electric charge generated by photoelectric conversion is accumulated or held as a signal. The electric charge generated before the time T1 is held in the holding portion 2. The exposure in the previous frame ends by controlling the first transfer switch 4 for transferring an electric charge from the photoelectric conversion portion 1 to the holding portion 2 to shift from an on-state to an off-state simultaneously in all the pixels (the time T1 in FIG. 1).

Further, at the time T1, all electric charges in the photoelectric conversion portions 1 are transferred to the respective holding portions 2. As a result, the photoelectric conversion portions 1 enter an initial state. Thus, at the time T1, the photoelectric conversion portions of the pixels in the three rows simultaneously start accumulating electric charges. As described above, in the present exemplary embodiment, the first transfer switch 4 is turned off, whereby the photoelectric conversion portion 1 starts accumulating an electric charge.

From the time T1 to a time T2 at which a first period elapses, the first transfer switch 4 is maintained in the off-state. In the present exemplary embodiment, the first transfer switches 4 of all the pixels are maintained in the off-state. However, the first transfer switch 4 of at least one of the pixels may only need to be maintained in the off-state from the time T1 to the time T2. It is desirable that in the above combination of pixels for phase difference detection, similar operations should be performed in view of use for detecting the phase difference at the same time.

The time when the first period has elapsed from the time T1 is the time T2. In other words, the period from the time T1 to the time T2 is the first period. During the first period, an electric charge generated during the first period is accumulated in the photoelectric conversion portion 1. Meanwhile, during the first period, the electric charge generated in the previous frame is held in the holding portion 2.

Then, in the first period, the electric charge in the holding portion 2 is sequentially read and transferred to the input node 3 of the amplification unit 10. More specifically, the second transfer switches 5 in the m-th row are turned on, thereby transferring the electric charge in the holding portion 2 of each of the pixels in the m-th row to the input node 3. According to the capacity of the input node 3 and the amount of transferred electric charge, the voltage of the input node 3 changes. The amplification unit 10 outputs a signal based on the voltage of the input node 3 to the output line 8. Next, a similar operation is performed on the pixels in the m+1-th row. This operation is performed on each of the pixels in the first row to the pixels in the last row. After the reading is performed on the last pixel, the first transfer switches 4 and the second transfer switches 5 of all the pixels are turned off.

At the time T2, the first transfer switch 4 is turned on. Consequently, the electric charge in the photoelectric conversion portion 1 is transferred to the holding portion 2. Thus, from after the time T2, the electric charge generated during the first period is held in the holding portion 2. In present exemplary embodiment, the first transfer switches 4 of all the pixels simultaneously transition from the off-state to on-state. The first transfer switches 4 of the plurality of pixels, however, may only need to be turned on by the time T2, and the timing of the transition may be different between the plurality of pixels. For example, the first transfer switch 4 may be turned on in order from a pixel of which the above reading operation is finished.

Then, from the time T2 to a time T3 at which a second period has elapsed, the holding portion 2 holds both the electric charge generated during the first period and an electric charge generated during the second period. In the present exemplary embodiment, during the second period, the first transfer switch 4 is maintained in the on-state. Thus, the electric charge generated during the second period is immediately transferred to the holding portion 2. It is possible to arbitrarily set the period during which an electric charge is transferred from the photoelectric conversion portion 1 to the holding portion 2. During a part of the second period, the first transfer switch 4 may be off. For example, the first transfer switches 4 of the plurality of pixels may be turned on at the time T2 and shortly thereafter may be turned off. Then, until immediately before the time T3, the first transfer switches 4 of the plurality of pixels may be maintained in the off-state. In FIG. 4, a control signal used for driving of turning off the first transfer switch 4 during a part of the second period is indicated by a dotted line.

At the time T3, the first transfer switches 4 of the pixels in all the rows are simultaneously controlled to shift from the on-state to off-state. Consequently, the exposure period in a single frame ends. As described above, the exposure periods of all the pixels coincide with each other. In other words, in all the pixels, an exposure starts at the time T1 and ends at the time T3. Further, at the time T3, an exposure in the next frame is started, and thereafter, the operation from the time T1 to the time T3 is repeated.

Figure 5:
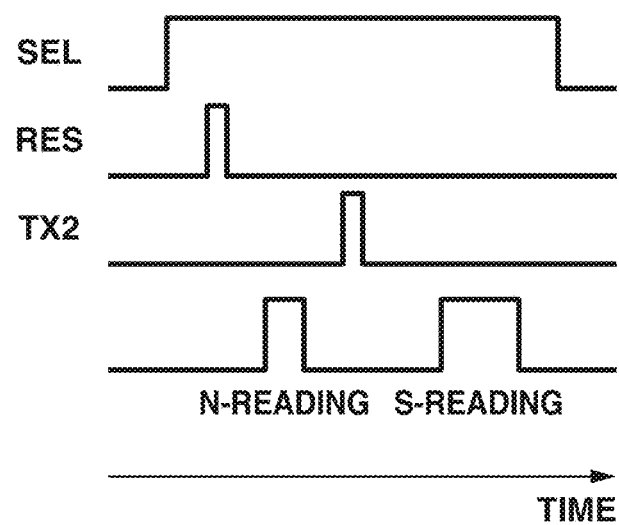
FIG. 5 is a diagram illustrating driving pulses of the imaging device.

Next, the operation of reading a signal from a single pixel is briefly described. FIG. 5 schematically illustrates driving pulses used by the imaging device. FIG. 5 illustrates a driving pulse SEL, which is supplied to the selection transistor 7, a driving pulse RES, which is supplied to the reset transistor 9, and a driving pulse Tx2, which is supplied to the second transfer switch 5. When a driving pulse is at a high level, the corresponding transistor or switch is turned on. When a driving pulse is at a low level, the corresponding transistor or switch is turned off.

According to the driving pulses illustrated in FIG. 5, selecting a pixel, a reset, reading a noise signal (N-reading), transferring an electric charge, and reading an optical signal, are performed (S-reading). An output signal may be subjected to analog-to-digital (AD) conversion outside the imaging device, or may be subjected to AD conversion inside the imaging device.

Figure 6:
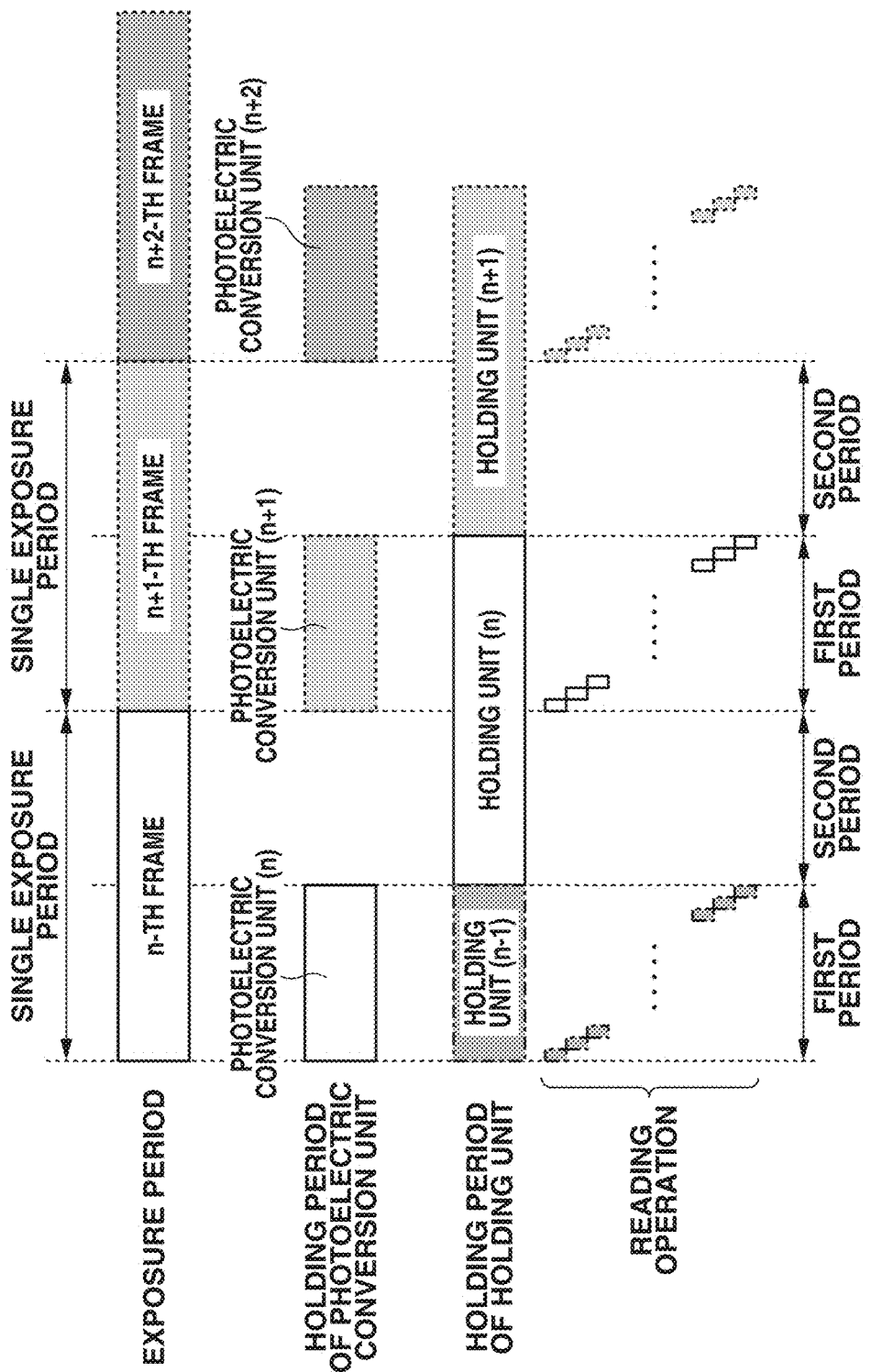
FIG. 6 is a diagram schematically illustrating an operation of the imaging device.

Next, the effect of the present exemplary embodiment is described. FIG. 6 schematically illustrates an operation of the imaging device. FIG. 6 illustrates an imaging operation from an n-th frame to an n+1-th frame. The operation regarding the n-th frame is indicated by a solid line, and the operation regarding the n+1-th frame is indicated by a dotted line.

FIG. 6 illustrates the exposure period, the period during which the photoelectric conversion portion 1 accumulates an electric charge, and the period during which the holding portion 2 holds an electric charge, in each frame. Further, FIG. 6 illustrates a state where, in the first period, a reading operation is performed on the plurality of pixels. The reading operation in FIG. 6 refers to an operation including the transfer of an electric charge by the second transfer switch 5 and the output of a signal from the amplification unit 10, which have been described with reference to FIGS. 4 and 5.

As illustrated in FIG. 6, immediately after the exposure for a single frame ends, the next exposure can be started. Therefore, it is possible to substantially eliminate the period of missing information. Thus, it is possible to improve image quality.

Further, as illustrated in FIG. 6, in the first period during which the photoelectric conversion portion 1 accumulates an electric charge, the reading operation is performed on each of the plurality of pixels. Therefore, even if the amount of saturation charge of the photoelectric conversion portion 1 is small, it is possible to increase the amount of saturation charge of the pixel. The amount of saturation charge of the pixel is the maximum value of the amount of electric charge that can be treated as signals among electric charges generated in a single exposure. The amount of saturation charge of the photoelectric conversion portion 1 is the maximum value of the amount of electric charge that can be accumulated in the photoelectric conversion portion 1, and the amount of saturation charge of the holding portion 2 is the maximum value of the amount of electric charge that can be held in the holding portion 2. The amount of saturation charge of the holding portion 2 is defined by the difference between the depletion voltage of the photoelectric conversion portion 1 and the depletion voltage of the holding portion 2.

A single exposure period is the total of the first and second periods. At this time, an electric charge of the previous frame held in the holding portion 2 is read in the first period. Thus, if the first period ends, the holding portion 2 can hold an electric charge. Therefore, the photoelectric conversion portion 1 only needs to be able to accumulate at least an electric charge generated during the first period. Typically, the amount of electric charge generated during the first period is smaller than the amount of electric charge generated during the single exposure period. Thus, it is possible to make the amount of saturation charge of the photoelectric conversion portion 1 small.

As illustrated in FIG. 6, in the present exemplary embodiment, the first period during which the photoelectric conversion portion 1 accumulates an electric charge is almost equal to the second period during which the holding portion 2 holds an electric charge. Alternatively, the second period during which the holding portion 2 holds an electric charge may be longer than the first period. Yet alternatively, the first period may be longer than the second period.

FIG. 6 illustrates an example where the reading operation is performed in order from the first row. However, the order of performing the reading operation is not limited to this example. In the first period, reading may only need to be performed at least once on each of the pixels included in a single frame. Further, in at least some of the pixels, the period from when the holding portion 2 starts holding an electric charge in a certain frame to when the holding portion 2 starts holding an electric charge in the next frame is equal to the exposure period.

It is desirable that the ratio of the total of the first and second periods to the first period should be almost equal to the ratio of the amount of saturation charge of the holding portion 2 to the amount of saturation charge of the photoelectric conversion portion 1. In this case, the total of the first and second periods refers to the single exposure period.

In the present exemplary embodiment, the ratio of the single exposure period to the first period is 2. In other words, the first period is ½ of the single exposure period. For example, in a case where a moving image of 60 frames per second is captured, the first period is $\frac{1}{120}$ seconds.

Thus, it is desirable that the ratio of the amount of saturation charge of the holding portion 2 to the amount of saturation charge of the photoelectric conversion portion 1 should be close to 2. This is because the photoelectric conversion portion 1 only needs to hold electric charges of which the amount is ½ of the electric charges generated during the single exposure period, whereas the holding portion 2 holds all electric charges generated during the single exposure period. With such a ratio between the amounts of saturation charge, it is possible to optimize the sizes of the photoelectric conversion portion 1 and the holding portion 2.

The imaging device according to the present exemplary embodiment may have an operation mode for performing a rolling shutter. In the operation mode of the rolling shutter, the photoelectric conversion portions 1 of the plurality of pixels sequentially start accumulating electric charges. Then, the first transfer switches 4 of the plurality of pixels are sequentially controlled to be turned on. Alternatively, the imaging device may have an operation mode of another method for performing a global electronic shutter. The global electronic shutter of another method is an operation in which the period during which the photoelectric conversion portion 1 accumulates an electric charge is equal to the exposure period.

As described above, according to the imaging device of the present exemplary embodiment, it is possible to perform a global electronic shutter while improving the amount of saturation charge. Further, at the same time, it is also possible to output signals for phase difference detection of which the accumulation times are equal.

A second exemplary embodiment is described. The present exemplary embodiment is different from the first exemplary embodiment in that a pixel includes a discharge switch. Therefore, only the differences from the first exemplary embodiment are described, and portions similar to those of the first exemplary embodiment are not described here.

Figure 7:
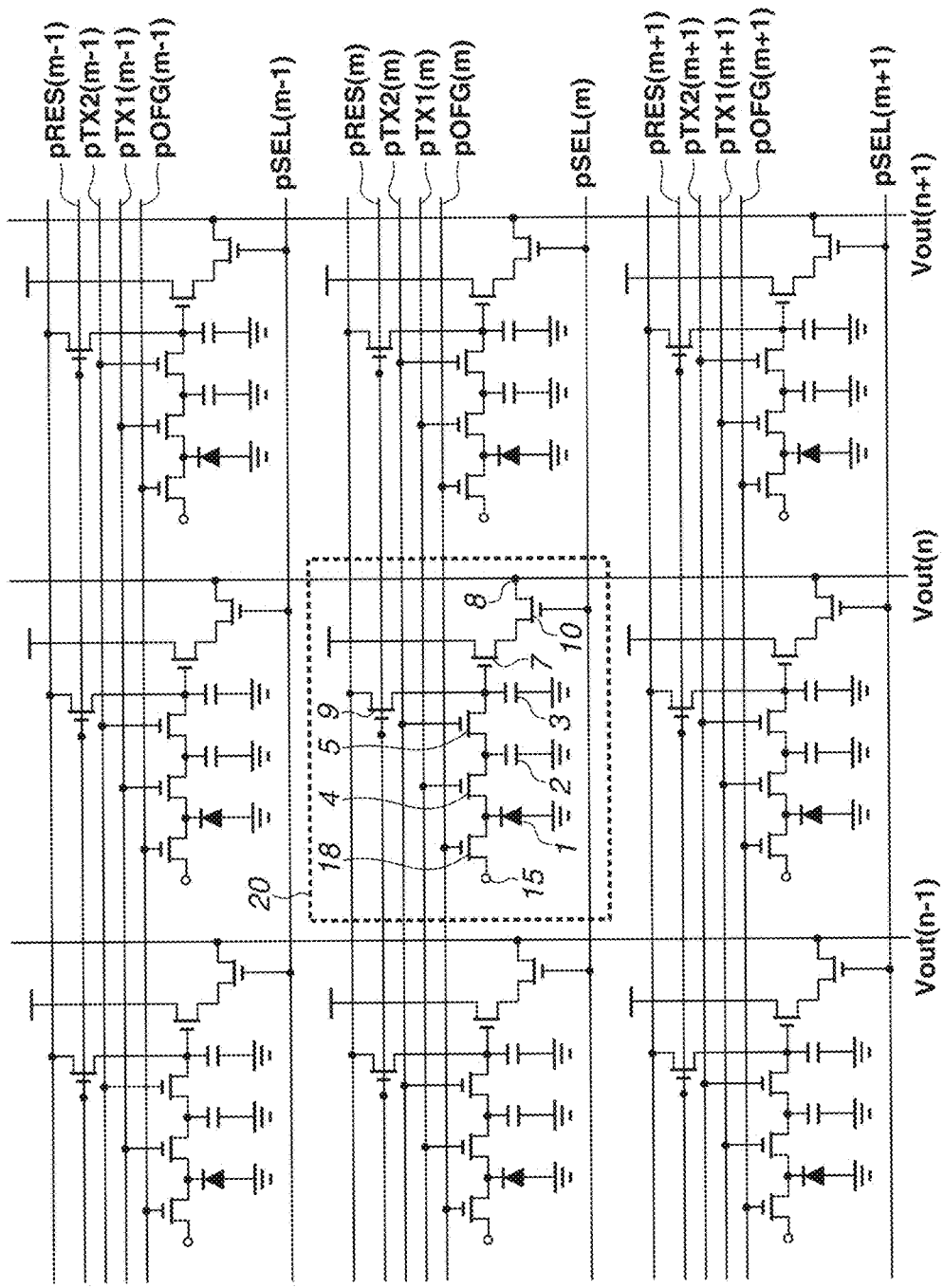
FIG. 7 is a diagram illustrating an equivalent circuit of pixels of an imaging device.

FIG. 7 illustrates an equivalent circuit of pixels of an imaging device. Portions similar to those of FIG. 1 are designated by the same numerals.

Each pixel 20 includes a discharge switch 18. The discharge switch 18 discharges an electric charge in the photoelectric conversion portion 1 to a power supply node 15 such as an overflow drain. To the discharge switch 18, a control line OFG is connected. The discharge switch 18 is a MOS transistor, for example.

Figure 8:
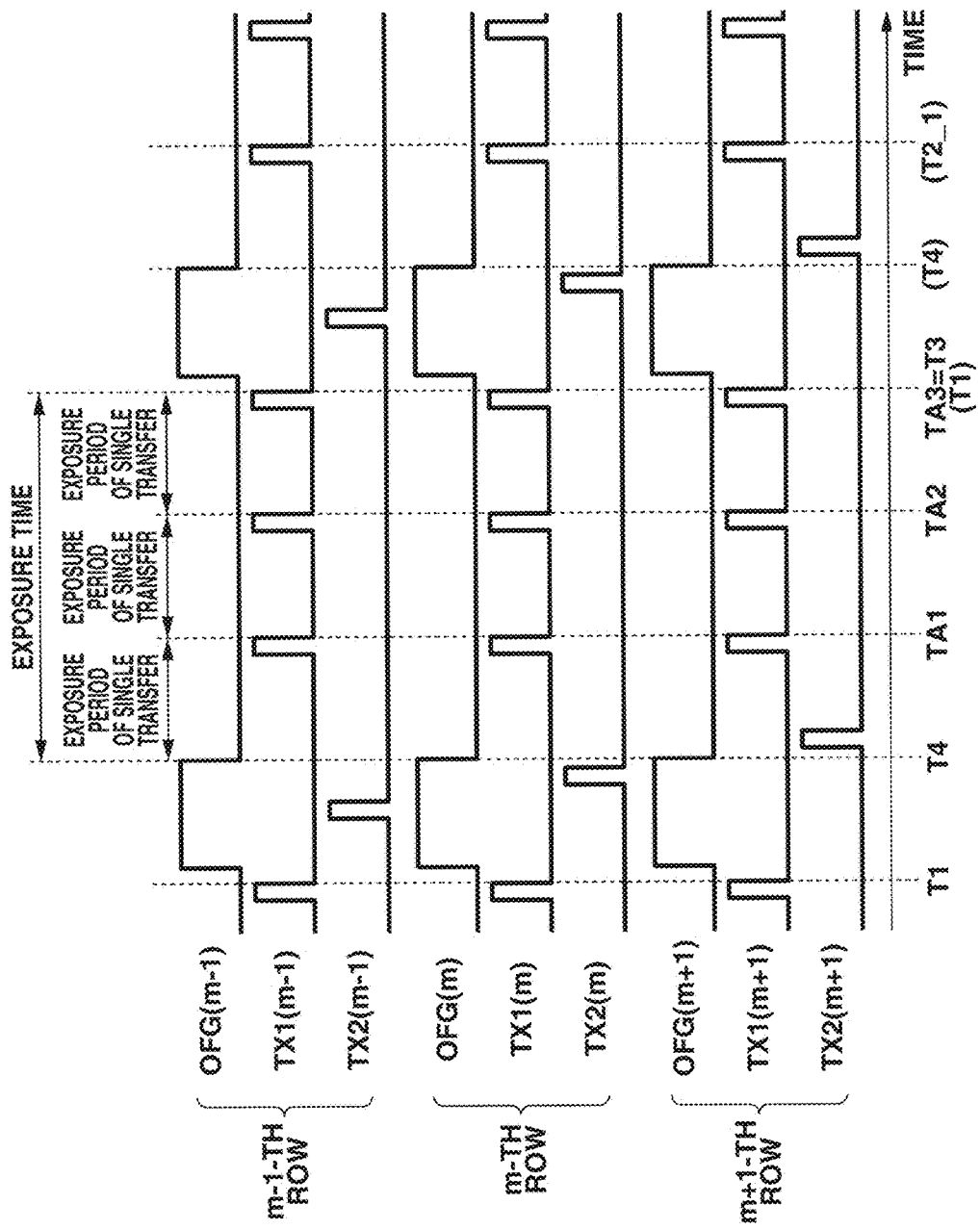
FIG. 8 is a diagram illustrating driving pulses of the imaging device.

In the first exemplary embodiment, the first transfer switch 4 is controlled to shift from an on-state to an off-state, whereby the photoelectric conversion portion 1 starts accumulating an electric charge. In the present exemplary embodiment, as illustrated in FIG. 8, it is also possible to control the discharge switch 18 to start an exposure. More specifically, the discharge switch 18 is controlled to shift from an on-state to an off-state, whereby the photoelectric conversion portion 1 starts accumulating an electric charge. With this operation, it is possible to arbitrarily set the exposure time.

Further, the configuration is such that in a part of the second period, the first transfer switch 4 is off, and the first transfer switch 4 is also driven three times. With this operation, it is possible to treat electric charges corresponding to a maximum of three times as much as those in the photoelectric conversion portion 1.

Cross-sectional structures and a top view of the imaging device are similar to those in the first exemplary embodiment. In other words, FIGS. 2A, 2B, 2C, and 3 illustrate cross-sectional structures and a top view of pixels of the imaging device according to the present exemplary embodiment. The descriptions of FIGS. 2A, 2B, 2C, and 3 are similar to those in the first exemplary embodiment and therefore are omitted.

According to a voltage supplied from the control line OFG, the discharge switch 18 discharges an electric charge in the photoelectric conversion portion 1 to the overflow drain 15 to which a predetermined voltage is supplied.

A method for driving the imaging device according to the present exemplary embodiment is described. FIG. 8 schematically illustrates driving pulses used in the present exemplary embodiment. FIG. 8 illustrates driving pulses supplied to the control line Tx1, the control line Tx2, and the control line OFG of each pixel in m−1-th to m+1-th rows. The driving pulse supplied to the control line Tx2 is similar to that in the first exemplary embodiment.

When a driving pulse is at a high level, the corresponding transistor or switch is turned on. When a driving pulse is at a low level, the corresponding transistor or switch is turned off. These driving pulses are supplied from a control unit disposed in the imaging device. As the control unit, a logic circuit such as a shift register or an address decoder is used.

In FIG. 8, at a time T4, the discharge switch 18 is controlled to shift from an on-state to an off-state. While the discharge switch 18 is on, a generated electric charge is discharged. Thus, according to the driving in FIG. 8, the exposure period is from the time T4 to a time T3. In this exposure period, the control line Tx1 is driven a plurality of times, thereby transferring an electric charge from the photoelectric conversion portion 1 to the holding portion 2 a plurality of times. A single exposure period is the total of the period from the time T4 to a time TA1 (exposure period for a single transfer), the period from the time TA1 to a time TA2, and the period from the time TA2 to a time TA3. The period from the time T4 to the time TA1 corresponds to the first period in FIG. 4. Further, the period from the time TA1 to the time TA3 corresponds to the second period in FIG. 4. The time TA3 and the time T3 are the same time. To reduce the unevenness of accumulation in the respective exposure periods, it is desirable to set approximately equal periods as the exposure periods. Further, to shorten the exposure periods, the time T4 may be set to, for example, the second period described in the first exemplary embodiment.

According to the present exemplary embodiment, it is possible to change the driving method according to the brightness of an object. For example, typically, the driving pulses in FIG. 4 can be used. When the object is bright, the driving pulses in FIG. 8 can be used. When the object is brighter, driving pulses obtained by setting the time T4 in FIG. 8 to a later time can be used.

In FIG. 8, at the time T4, the photoelectric conversion portion 1 starts accumulating an electric charge. Then, from the time T4 to the time T3, the discharge switch is maintained in the off-state. Further, a reading operation is performed based on the driving pulses illustrated in FIG. 5.

Figure 9:
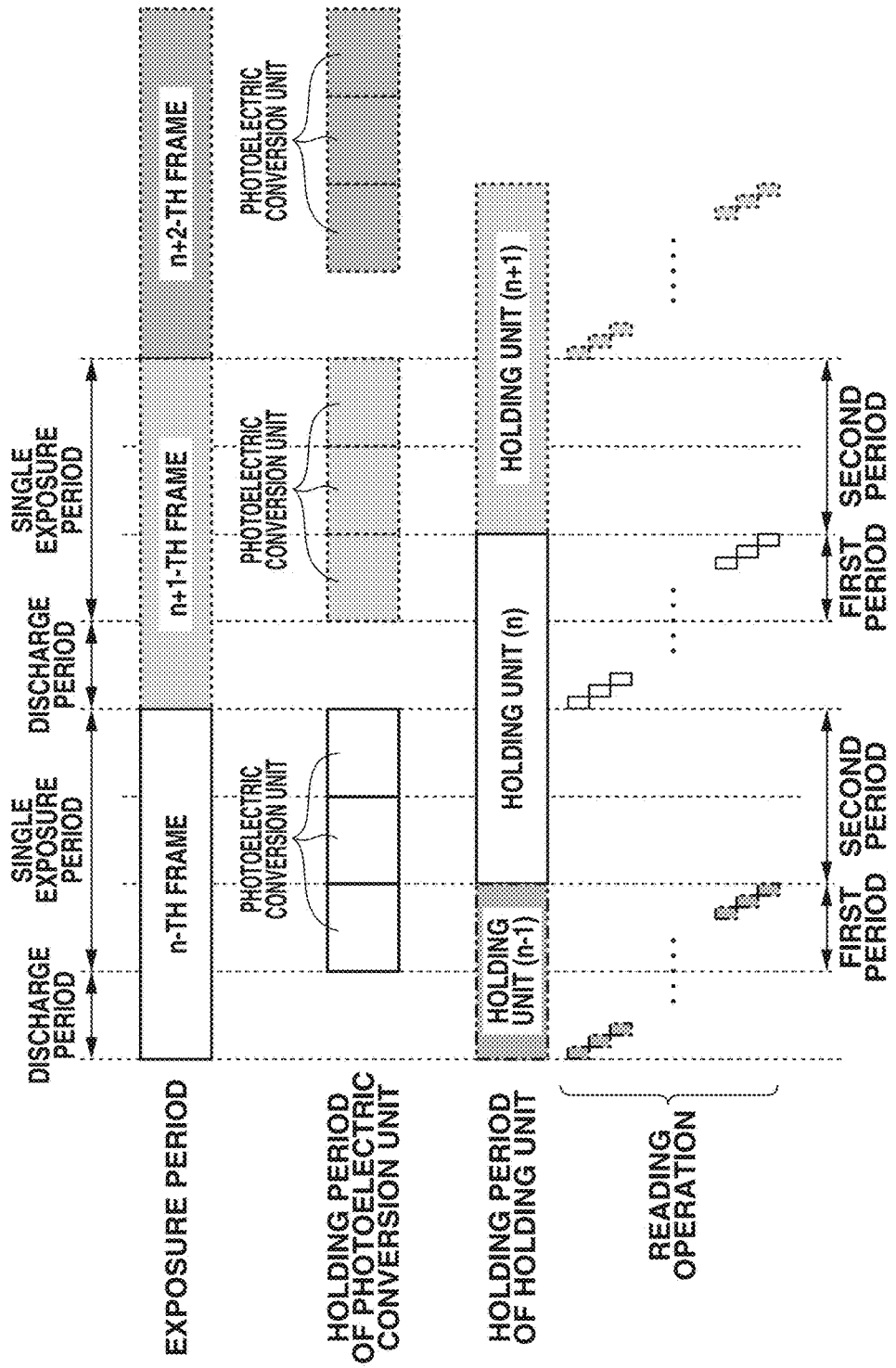
FIG. 9 is a diagram schematically illustrating an operation of the imaging device.

Next, the effect of the present exemplary embodiment is described. FIG. 9 schematically illustrates an operation of the imaging device. FIG. 9 illustrates an imaging operation from an n-th frame to an n+1-th frame. The operation regarding the n-th frame is indicated by a solid line, and the operation regarding the n+1-th frame is indicated by a dotted line.

FIG. 9 illustrates the exposure period, the period during which the photoelectric conversion portion 1 accumulates an electric charge, and the period during which the holding portion 2 holds an electric charge, for each frame. Further, FIG. 9 illustrates a state where, in the first period, a reading operation is performed on the plurality of pixels. The reading operation in FIG. 9 refers to an operation including the transfer of an electric charge by the second transfer switch 5 and the output of a signal from the amplification unit 10, which have been described with reference to FIG. 5.

As illustrated in FIG. 9, in the first period during which the photoelectric conversion portion 1 accumulates an electric charge, the reading operation is performed only on each of some of the pixels included in the imaging device. In this case also, even if the amount of saturation charge of the photoelectric conversion portion 1 is small, it is possible to increase the amount of saturation charge of the pixel. A single exposure period is the total of the first and second periods. At this time, an electric charge in the previous frame held in the holding portion 2 is read in or before the first period. Thus, if the first period ends, the holding portion 2 can hold an electric charge. Therefore, the photoelectric conversion portion 1 only needs to be able to accumulate at least an electric charge generated during the first period. Typically, the amount of electric charge generated during the first period is smaller than the amount of electric charge generated during the single exposure period. Thus, it is possible to make the amount of saturation charge of the photoelectric conversion portion 1 small.

It is desirable that the ratio of the total of the first and second periods to the first period should be substantially equal to the ratio of the amount of saturation charge of the holding portion 2 to the amount of saturation charge of the photoelectric conversion portion 1. In this case, the total of the first and second periods refers to the single exposure period.

In the present exemplary embodiment, the ratio of the single exposure period to the first period is 3. In other words, the first period is ⅓ of the single exposure period. Further, the discharge period during which the discharge switch 18 is on is almost equal to the first period. For example, in a case where a moving image of 60 frames per second is captured, the first period is 1/240 seconds.

Therefore, it is desirable that the ratio of the amount of saturation charge of the holding portion 2 to the amount of saturation charge of the photoelectric conversion portion 1 should be close to 3. This is because the photoelectric conversion portion 1 only needs to hold electric charges of which the amount is ⅓ of the electric charges generated during the single exposure period, whereas the holding portion 2 holds all electric charges generated during the single exposure period. With such a ratio between the amounts of saturation charge, it is possible to optimize the sizes of the photoelectric conversion portion 1 and the holding portion 2.

As described above, according to the present exemplary embodiment, it is possible to arbitrarily set an exposure period in addition to the effect of the first exemplary embodiment.

A third exemplary embodiment is described. The present exemplary embodiment is different from the first and second exemplary embodiments in the configuration of a pixel for detecting a phase difference on an imaging plane. Thus, only the differences from the first and second exemplary embodiments are described, and portions similar to those of the first or second exemplary embodiment are not described here.

Figure 10:
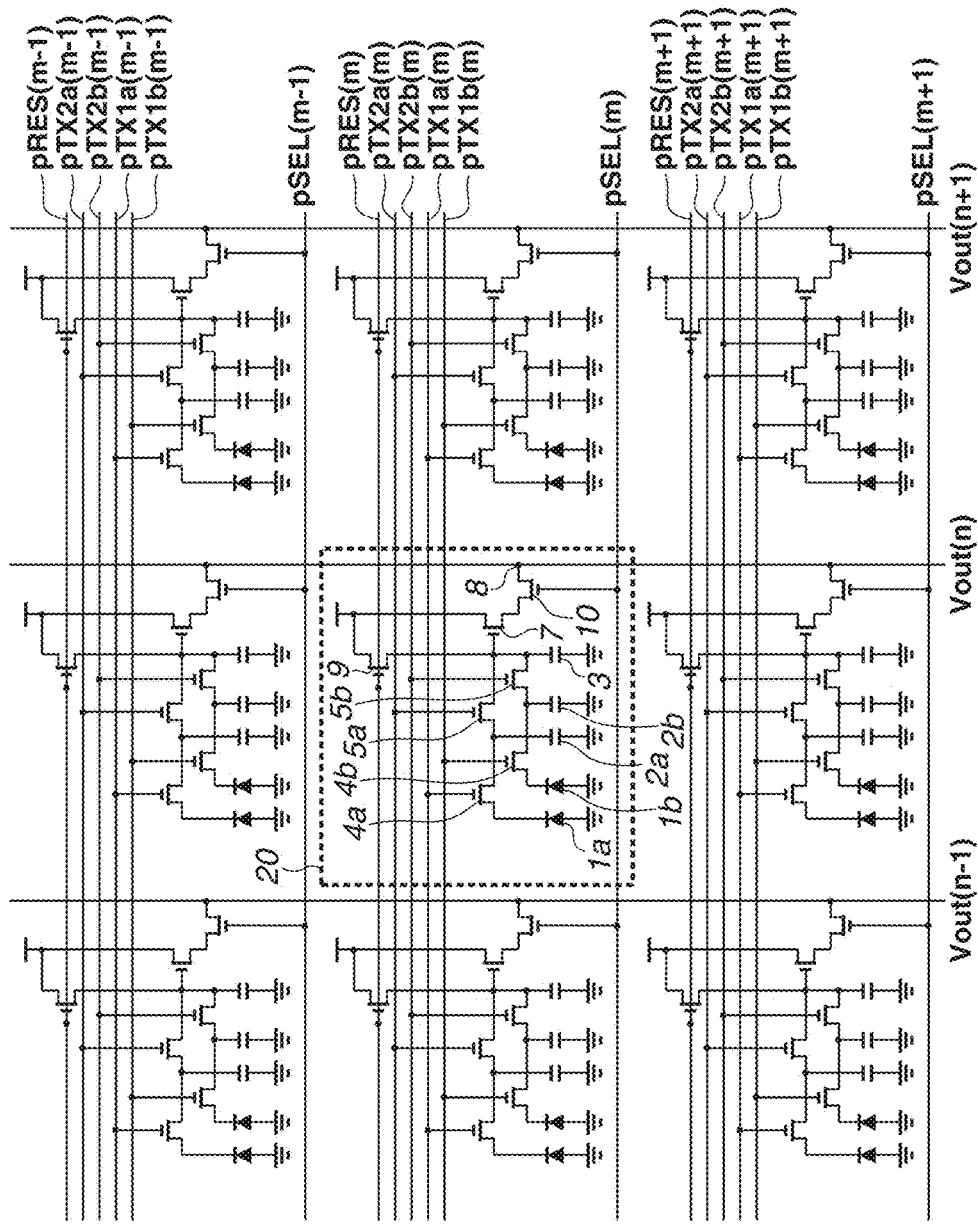
FIG. 10 is a diagram illustrating an equivalent circuit of pixels of an imaging device.

FIG. 10 illustrates an equivalent circuit of pixels of an imaging device. Portions similar to those of FIG. 1 are designated by the same numerals. FIG. 10 is different from FIG. 1 in that the photoelectric conversion portion 1 includes a plurality of accumulation regions. The circuit diagram in FIG. 10 illustrates the plurality of accumulation regions as photoelectric conversion portions 1a and 1b for convenience. Corresponding to the plurality of accumulation regions, two holding portions 2, two first transfer switches 4, and two second transfer switches 5 may be included. More specifically, the holding portion 2 includes a plurality of holding regions corresponding to the plurality of accumulation regions. The circuit diagram in FIG. 10 illustrates the plurality of holding regions as holding portions 2a and 2b for convenience. The first transfer switch 4 includes a plurality of first transfer transistors 4a and 4b corresponding to the plurality of accumulation regions. Further, the second transfer switch includes a plurality of second transfer transistors 5a and 5b corresponding to the plurality of holding regions. Using such a configuration, a pixel can output a signal for focus detection by the image plane phase difference method. For example, in a case where the photoelectric conversion portions 1a and 1b are placed to be arranged to the left and right, it is possible to output a signal for detecting the phase difference in the left-right direction.

The input node 3 of the amplification unit 10 and the subsequent members and operations are similar to those in FIG. 1 and therefore are not described here.

With such a configuration, the photoelectric conversion portions 1a and 1b can accumulate electric charges generated while the holding portion 2 holds an electric charge. Therefore, it is possible to perform both an imaging operation in which the periods of photoelectric conversion in a plurality of pixels coincide with each other, i.e., a so-called global electronic shutter, and phase difference detection.

Figure 11:
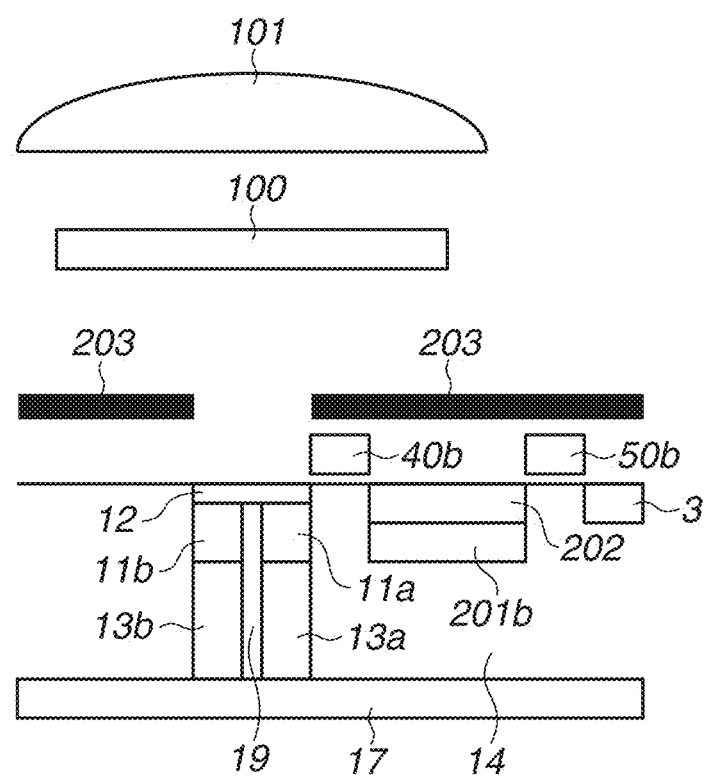
FIG. 11 is a diagram schematically illustrating a cross-sectional structure of a pixel of the imaging device.

FIG. 11 schematically illustrates a cross-sectional structure of the imaging device. Portions having functions similar to those in FIG. 10 are designated by the same numerals. Further, portions having functions similar to those in FIGS. 2A, 2B, and 2C are designated by the same numerals. However, two photoelectric conversion portions 1, two holding portions 2, two first transfer switches 4, and two second transfer switches 5 are disposed. Therefore, alphabetical letters are added to the end of the numbers to distinguish these from each other.

A pixel 20 includes a photoelectric conversion portion 1a, which includes an accumulation region 11a, and a photoelectric conversion portion 1b, which includes an accumulation region 11b. In the description, for convenience, the pixel 20 includes two photoelectric conversion portions. More specifically, the pixel 20 includes a single photoelectric conversion portion, and the single photoelectric conversion portion includes accumulation regions 11a and 11b. As illustrated in FIG. 11, the accumulation regions 11a and 11b are disposed under a single microlens 101. Between the accumulation regions 11a and 11b, a separation region 19 is provided. The separation region 19 includes a P-type semiconductor region. The separation region 19 is not necessarily formed with a uniform impurity concentration. For example, a part of the separation region 19 may be formed with a low concentration, or may be an N-type semiconductor region. The separation region 19 electrically separates the accumulation regions 11a and 11b from each other. FIG. 11 illustrates an imaging device of a front-side illumination type. Alternatively, an imaging device of a back-side illumination type may be used. The other members are similar to those in FIGS. 2A, 2B, and 2C and therefore are not described here.

Figure 12:
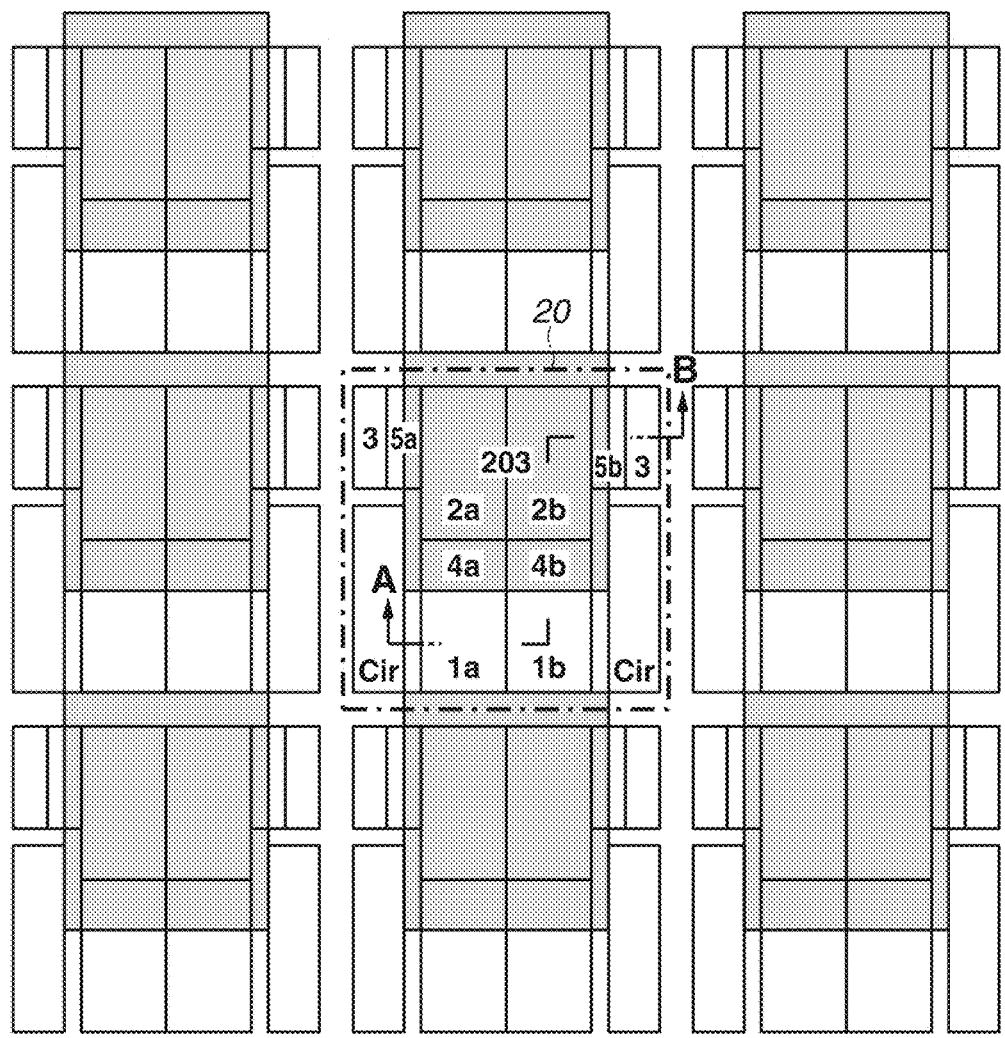
FIG. 12 is a diagram schematically illustrating an upper surface structure of pixels of the imaging device.

FIG. 12 schematically illustrates an upper surface structure of the imaging device. Portions having functions similar to those in FIGS. 10 and 11 are designated by the same numerals. Further, portions having functions similar to those in FIG. 3 are designated by the same numerals. However, two photoelectric conversion portions 1, two holding portions 2, two first transfer switches 4, and two second transfer switches 5 are disposed. Thus, alphabetical letters are added to the end of the numbers to distinguish these from each other. FIG. 11 illustrates a cross section taken along a line A-B in FIG. 12.

A pixel 20 includes photoelectric conversion portions 1a and 1b. The pixel 20 includes holding portions 2a and 2b. The pixel 20 includes first transfer transistors 4a and 4b. The pixel 20 includes second transfer transistors 5a and 5b. Further, the pixel 20 includes two floating diffusion (FD) regions, which form an input node 3 of an amplification unit. The two FD regions are connected to each other via wiring (not illustrated).

Using such a configuration, the pixel 20 can be used as a pixel for phase difference detection in the left-right direction. The other members are similar to those in FIG. 3 and therefore are not described here. The arrangement of the members and the shape of the light shielding portion are not limited to this example, and each member is appropriately placed. For example, in FIG. 12, all the pixels are pixels for focus detection. In a variation, only some of the plurality of pixels include a plurality of photoelectric conversion portions 1a and 1b. The other pixels include only a single photoelectric conversion portion 1. This variation is suitable for a case where only signals from some of the pixels are used for focus detection. Further, the configuration is illustrated in which the photoelectric conversion portion is divided into left and right portions. Alternatively, the configuration may be such that the photoelectric conversion portion is also divided into upper and lower portions to detect the phase difference between the upper and lower portions. Yet alternatively, both of these configurations may be included. More specifically, in a first pixel, a plurality of photoelectric conversion portions 1a and 1b are arranged along a first direction. In a second pixel, a plurality of photoelectric conversion portions 1a and 1b are arranged along a second direction intersecting the first direction. Further, the configuration may be such that the photoelectric conversion portion is divided into three or more portions to detect the phase difference more accurately, or the configuration may be such that the size of each photoelectric conversion portion is changed according to an arrangement location in the pixel region.

To improve the amount of saturation charge of a pixel, it is desirable that the holding portions 2a and 2b should have a large amount of saturation charge as the total amount of saturation charge of the holding portions 2a and 2b. The impurity concentration of the N-type semiconductor region 201 of each of the holding portions 2a and 2b is made high, or the area of the N-type semiconductor region 201 in a plan view is made large, whereby it is possible to increase the amounts of saturation charge of the holding portions 2a and 2b. However, if the impurity concentration of the N-type semiconductor region 201 is high, a leakage current is likely to become large, and therefore, noise may become large. Thus, the area of the N-type semiconductor region 201 in a plan view is made large, whereby it is possible to increase the amount of saturation charge while reducing the impurity concentration of the N-type semiconductor region 201.

As described above, the area of each of the holding portions 2a and 2b in a plan view, i.e., the area of the orthogonal projection of each of the holding portions 2a and 2b, is made large, whereby it is possible to increase the amount of saturation charge of the pixel while reducing noise. Consequently, the area of each of the photoelectric conversion portions 1a and 1b in a plan view is likely to be relatively small, and it is difficult to increase the amounts of saturation charge of the photoelectric conversion portions 1a and 1b. This makes the effect more prominent that even if the amounts of saturation charge of the photoelectric conversion portions 1a and 1b are small, it is possible to maintain the amount of saturation charge of the pixel.

Figure 13:
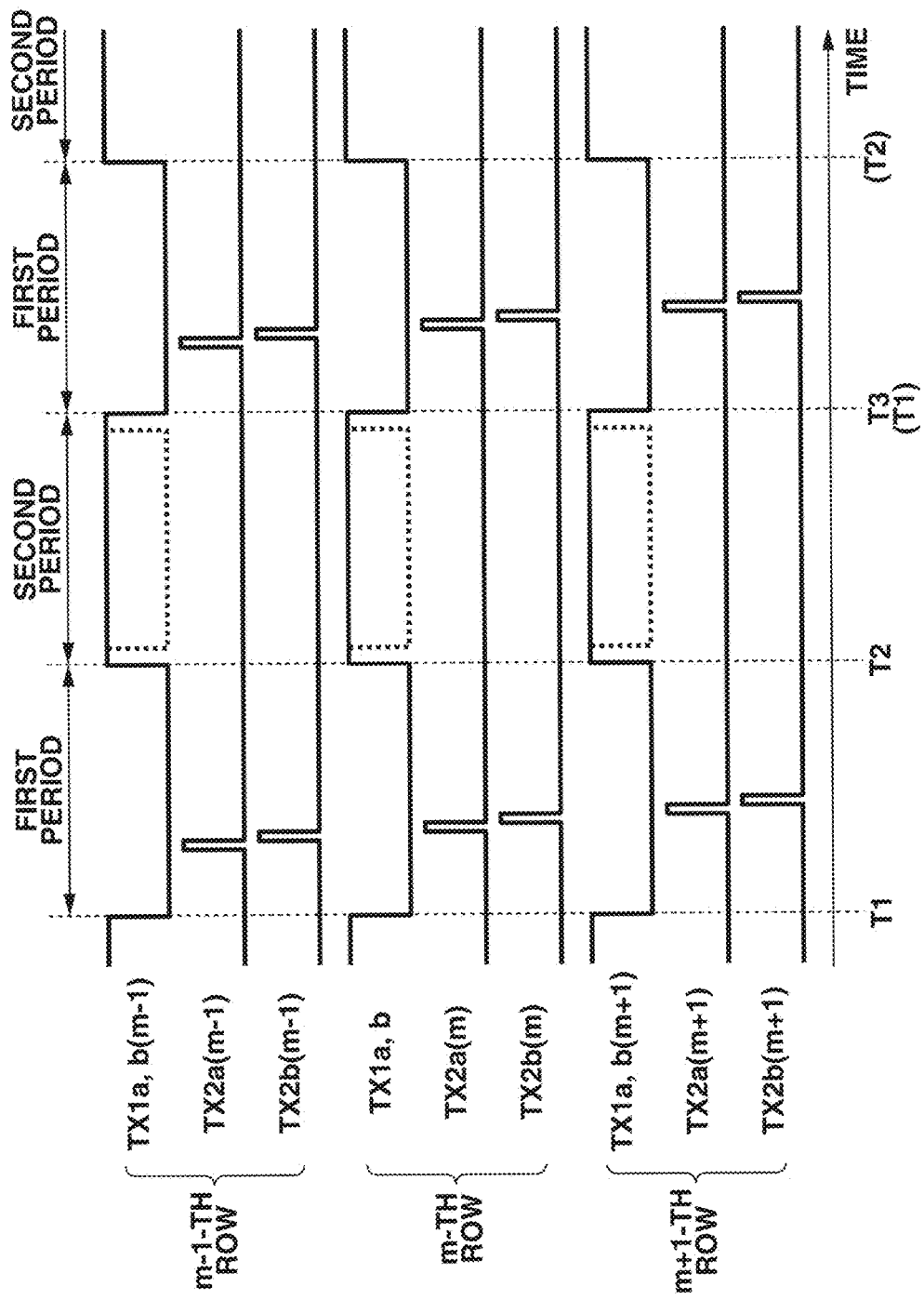
FIG. 13 is a diagram illustrating driving pulses of the imaging device.

A method for driving the imaging device according to the present exemplary embodiment is described. FIG. 13 schematically illustrates driving pulses used in the present exemplary embodiment. FIG. 13 illustrates a driving pulse supplied to the first transfer transistor 4a, a driving pulse supplied to the first transfer transistor 4b, a driving pulse supplied to the second transfer transistor 5a, and a driving pulse supplied to the second transfer transistor 5b. When a driving pulse is at a high level, the corresponding transistor or switch is turned on. When a driving pulse is at a low level, the corresponding transistor or switch is turned off. These driving pulses are supplied from a control unit disposed in the imaging device. As the control unit, a logic circuit such as a shift register or an address decoder is used.

In the present exemplary embodiment, the first transfer transistors 4a and 4b operate in a same phase with each other. Thus, the driving pulse supplied to the transistor 4a and the driving pulse supplied to the first transfer transistor 4b are collectively described. According to such a configuration, it is possible to make the accumulation times of two photoelectric conversion portions equal. Thus, it is possible to improve the accuracy of detecting a phase difference. In a case where the accumulation times do not necessarily need to be made equal, it is also possible to appropriately change the operation timing of the two first transfer transistors 4a and 4b. Further, the second transfer transistors 5a and 5b are controlled independently of each other.

The driving method according to the present exemplary embodiment is similar to that in FIG. 4, except that when a signal is read for each pixel, the second transfer transistors 5a and 5b are sequentially turned on. Therefore, portions similar to those in FIG. 4 are not described here.

Figure 14:
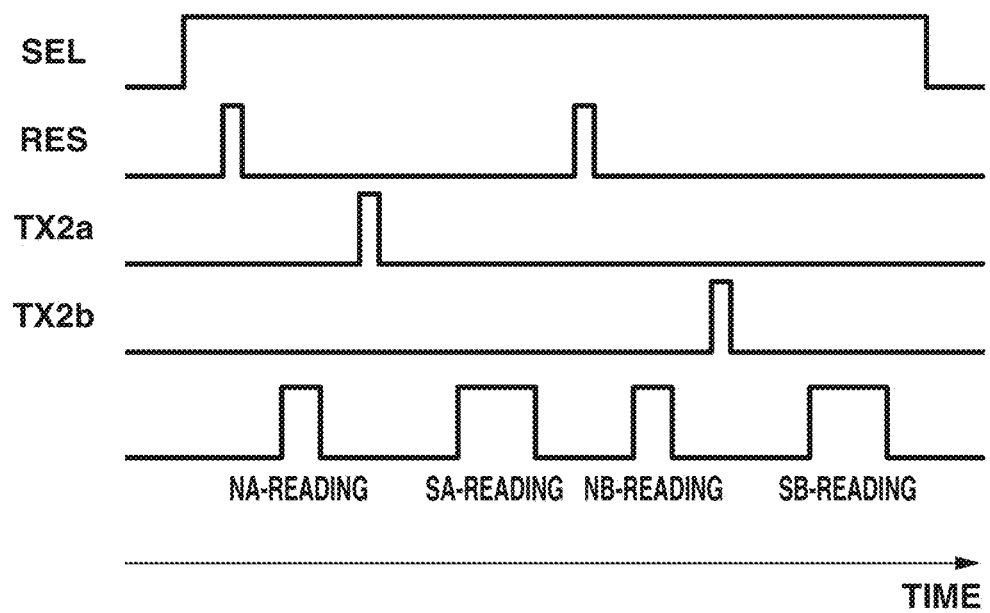
FIG. 14 is a diagram illustrating driving pulses of the imaging device.

An operation of reading a signal from a single pixel is described. FIG. 14 schematically illustrates driving pulses used by the imaging device. FIG. 14 is different from FIG. 5 in that a driving pulse Tx2a, which is supplied to the second transfer transistor 5a, and a driving pulse Tx2b, which is supplied to the second transfer transistor 5b, are included. A driving pulse SEL, which is supplied to the selection transistor 7, and a driving pulse RES, which is supplied to the reset transistor 9, are similar to those in FIG. 5. When a driving pulse is at a high level, the corresponding transistor or switch is turned on. When a driving pulse is at a low level, the corresponding transistor or switch is turned off.

According to the driving pulses illustrated in FIG. 14, a reset for the first time, reading a noise signal for the first time, transferring an electric charge in the holding portion 2a, reading an optical signal, a reset for the second time, reading a noise signal for the second time, transferring an electric charge in the holding portion 2b, and reading an optical signal, are performed. FIG. 14 illustrates a noise signal NA, which is read for the first time, a signal NB, which is read for the second time, and optical signals SA and SB. An output signal may be subjected to AD conversion outside the imaging device, or may be subjected to AD conversion inside the imaging device. Further, the reading order of the two holding portions 2a and 2b may be reversed. Further, it is also possible to speed up the operation by, for example, omitting the reading of a noise signal for the second time.

Next, the effect of the present exemplary embodiment is described. FIG. 6 schematically illustrates an operation of the imaging device, similar to the first exemplary embodiment. FIG. 6 illustrates an imaging operation from an n-th frame to an n+1-th frame. The operation regarding the n-th frame is indicated by a solid line, and the operation regarding the n+1-th frame is indicated by a dotted line.

FIG. 6 illustrates an exposure period, the period during which the photoelectric conversion portion 1 (the operations of the photoelectric conversion portions 1a and 1b are collectively described as a similar operation) accumulates an electric charge, and the period during which the holding portion 2 (the operations of the holding portions 2a and 2b are collectively described as a similar operation) holds an electric charge, for each frame. Further, FIG. 6 illustrates a state where, in the first period, a reading operation is performed on the plurality of pixels. The reading operation in FIG. 6 refers to an operation including the transfer of an electric charge by the second transfer transistor 5a or 5b and the output of a signal from the amplification unit 10, which have been described with reference to FIGS. 13 and 14.

As illustrated in FIG. 6, immediately after the exposure in a single frame ends, the next exposure can be started. Therefore, it is possible to substantially eliminate the period of missing information. Thus, it is possible to improve image quality.

Further, as illustrated in FIG. 6, in the first period during which the photoelectric conversion portion 1 accumulates an electric charge, the reading operation is performed on each of the plurality of pixels. Therefore, even if the amount of saturation charge of the photoelectric conversion portion 1 is small, it is possible to increase the amount of saturation charge of the pixel. The amount of saturation charge of the pixel is the maximum value of the amount of electric charge that can be treated as signals among electric charges generated in a single exposure. The amount of saturation charge of the photoelectric conversion portion 1 is the maximum value of the total amount of electric charge that can be accumulated in the photoelectric conversion portions 1a and 1b, and the amount of saturation charge of the holding portion 2 is the maximum value of the total amount of electric charge that can be held in the holding portions 2a and 2b. The amount of saturation charge of the holding portion 2a is defined by the difference between the depletion voltage of the photoelectric conversion portion 1a and the depletion voltage of the holding portion 2a. The amount of saturation charge of the holding portion 2b is defined by the difference between the depletion voltage of the photoelectric conversion portion 1b and the depletion voltage of the holding portion 2b.

A single exposure period is the total of the first and second periods. At this time, an electric charge in the previous frame held in the holding portion 2 is read in the first period. Thus, if the first period ends, the holding portion 2 can hold an electric charge. Thus, the photoelectric conversion portion 1 only needs to be able to accumulate at least an electric charge generated during the first period. Typically, the amount of electric charge generated during the first period is smaller than the amount of electric charge generated during the single exposure period. Thus, it is possible to make the amount of saturation charge of the photoelectric conversion portion 1 small.

As illustrated in FIG. 6, in the present exemplary embodiment, the first period during which the photoelectric conversion portion 1 accumulates an electric charge is almost equal to the second period during which the holding portion 2 holds an electric charge. Alternatively, the second period during which the holding portion 2 holds an electric charge may be longer than the first period. Yet alternatively, the first period may be longer than the second period.

FIG. 6 illustrates an example where the reading operation is performed in order from the first row. However, the order of performing the reading operation is not limited to this example. In the first period, reading may only need to be performed at least once on each of the pixels included in a single frame. Further, in at least some of the pixels, the period from when the holding portion 2 starts holding an electric charge in a certain frame to when the holding portion 2 starts holding an electric charge for the next frame is equal to the exposure period.

It is desirable that the ratio of the total of the first and second periods to the first period should be almost equal to the ratio of the amount of saturation charge of the holding portion 2 to the amount of saturation charge of the photoelectric conversion portion 1. In this case, the total of the first and second periods refers to the single exposure period.

In the present exemplary embodiment, the ratio of the single exposure period to the first period is 2. In other words, the first period is ½ of the single exposure period. For example, in a case where a moving image of 60 frames per second is captured, the first period is 1/120 seconds.

Therefore, it is desirable that the ratio of the amount of saturation charge of the holding portion 2 to the amount of saturation charge of the photoelectric conversion portion 1 should be close to 2. This is because the photoelectric conversion portion 1 only needs to hold electric charges of which the amount is ½ of the electric charges generated during the single exposure period, whereas the holding portion 2 holds all electric charges generated during the single exposure period. With such a ratio between the amounts of saturation charge, it is possible to optimize the sizes of the photoelectric conversion portion 1 and the holding portion 2.

The imaging device according to the present exemplary embodiment may have an operation mode for performing a rolling shutter. In the operation mode of the rolling shutter, the photoelectric conversion portions 1 of the plurality of pixels sequentially start accumulating electric charges. Then, the first transfer switches 4 of the plurality of pixels are sequentially controlled to be turned on. Alternatively, the imaging device may have an operation mode for performing a global electronic shutter of another method. The global electronic shutter of another method refers to an operation in which the period during which the photoelectric conversion portion 1 accumulates an electric charge is equal to the exposure period.

As described above, according to the imaging device of the present exemplary embodiment, it is possible to perform a global electronic shutter while improving the amount of saturation charge. Further, at the same time, it is also possible to output signals for phase difference detection of which the accumulation times are equal.

A fourth exemplary embodiment is described. The present exemplary embodiment is different from the third exemplary embodiment in that a pixel includes a discharge switch. Therefore, only the differences from the third exemplary embodiment are described, and portions similar to those of the third exemplary embodiment are not described here.

Figure 15:
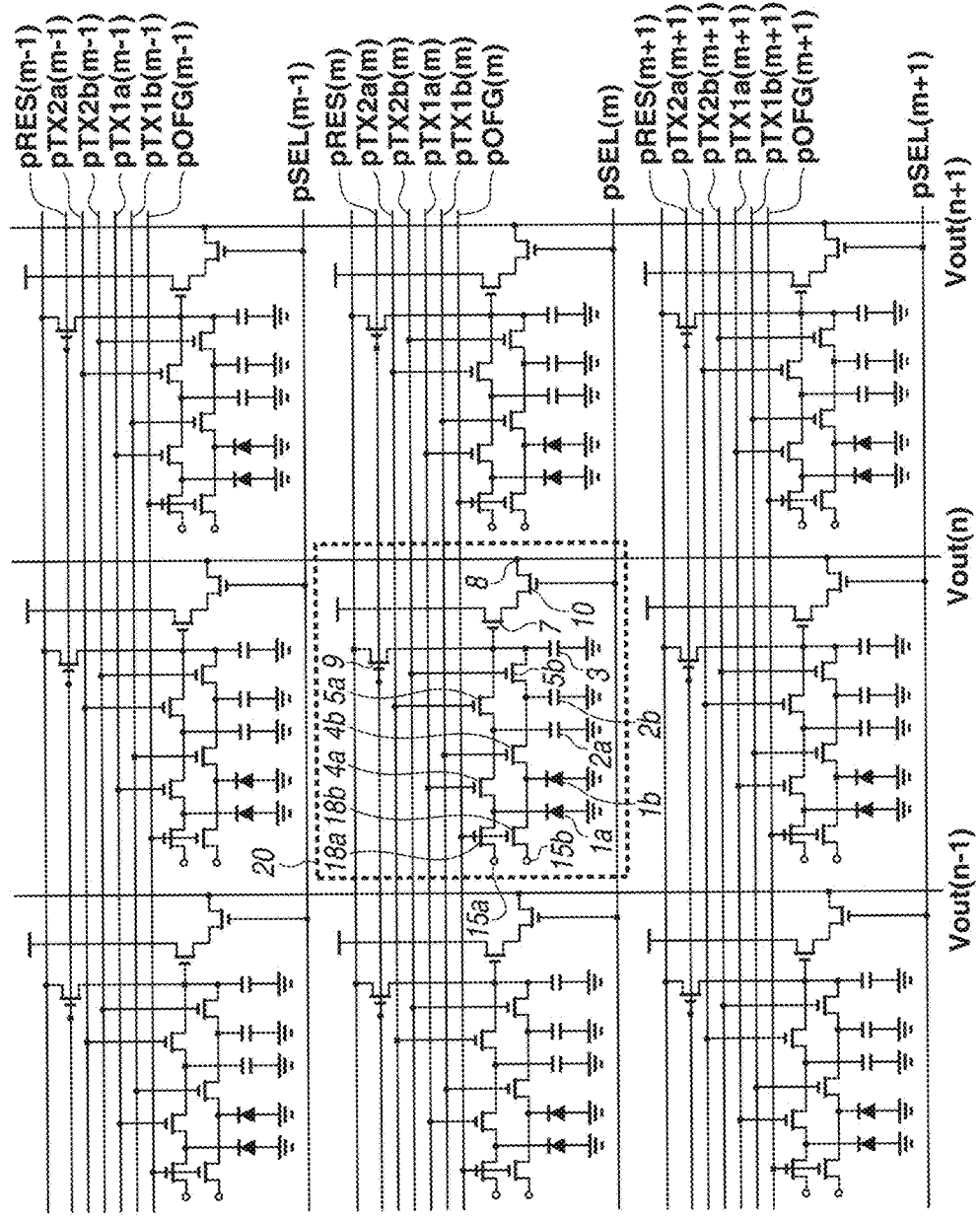
FIG. 15 is a diagram illustrating an equivalent circuit of pixels of an imaging device.

FIG. 15 illustrates an equivalent circuit of pixels of an imaging device. Portions similar to those of FIG. 10 are designated by the same numerals.

Each photoelectric conversion portion 1a includes a discharge switch 18a, and each photoelectric conversion portion 1b includes a discharge switch 18b. The discharge switches 18a and 18b discharge electric charges in the photoelectric conversion portions 1a and 1b to power supply nodes 15a and 15b such as overflow drains, respectively. To the discharge switches 18a and 18b, a control line OFG is connected. Each of the discharge switches 18a and 18b is a MOS transistor, for example.

In the third exemplary embodiment, the first transfer transistors 4a and 4b are controlled to shift from the on-state to off-state, whereby the photoelectric conversion portions 1a and 1b start accumulating electric charges. In the present exemplary embodiment, as illustrated in FIG. 15, it is also possible to control the discharge switches 18a and 18b to start exposures. More specifically, the discharge switches 18a and 18b are controlled to shift from the on-state to off-state, whereby the photoelectric conversion portions 1a and 1b start accumulating electric charges. With this operation, it is possible to arbitrarily set the exposure time. In this case, the control line OFG is common to the discharge switches 18a and 18b. Alternatively, it is also possible to set different control lines for the discharge switches 18a and 18b and change the exposure time.

Further, the configuration is such that during a part of the second period, the first transfer transistors 4a and 4b are off. Then, the photoelectric conversion portion 1a transfers an electric charge to the holding portion 2a three times, and the photoelectric conversion portion 1b transfers an electric charge to the holding portion 2b three times. With this operation, it is possible to treat electric charges corresponding to a maximum of three times as much as those in the photoelectric conversion portions 1a and 1b.

A cross-sectional structure of the imaging device is similar to that of the third exemplary embodiment. In other words, FIG. 11 illustrates a cross-sectional structure of a pixel of the imaging device according to the present exemplary embodiment. The description of FIG. 11 is similar to that of the third exemplary embodiment and therefore is omitted.

Figure 16:
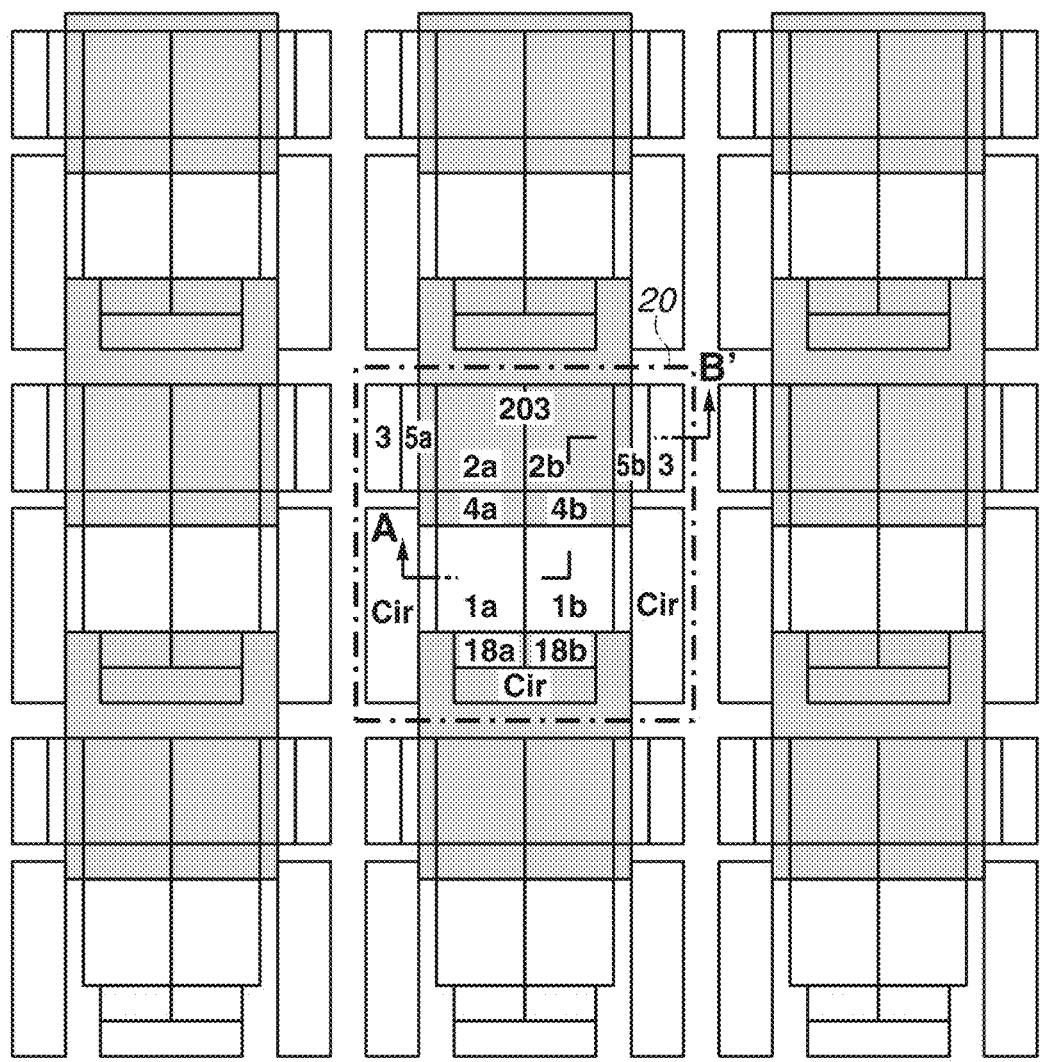
FIG. 16 is a diagram schematically illustrating an upper surface structure of pixels of the imaging device.

FIG. 16 illustrates a top view of pixels of the imaging device. FIG. 16 is different from FIG. 12 of the third exemplary embodiment in that the discharge switches 18a and 18b are added between the photoelectric conversion portions 1a and 1b. The other members are similar to those of the third exemplary embodiment and therefore are not described here. FIG. 11 illustrates a cross section taken along a line A-B in FIG. 16.

According to a voltage supplied from the control line OFG, the discharge switches 18a and 18b discharge electric charges in the photoelectric conversion portions 1a and 1b to the overflow drains 15a and 15b, respectively, to which a predetermined voltage is supplied.

Figure 17:
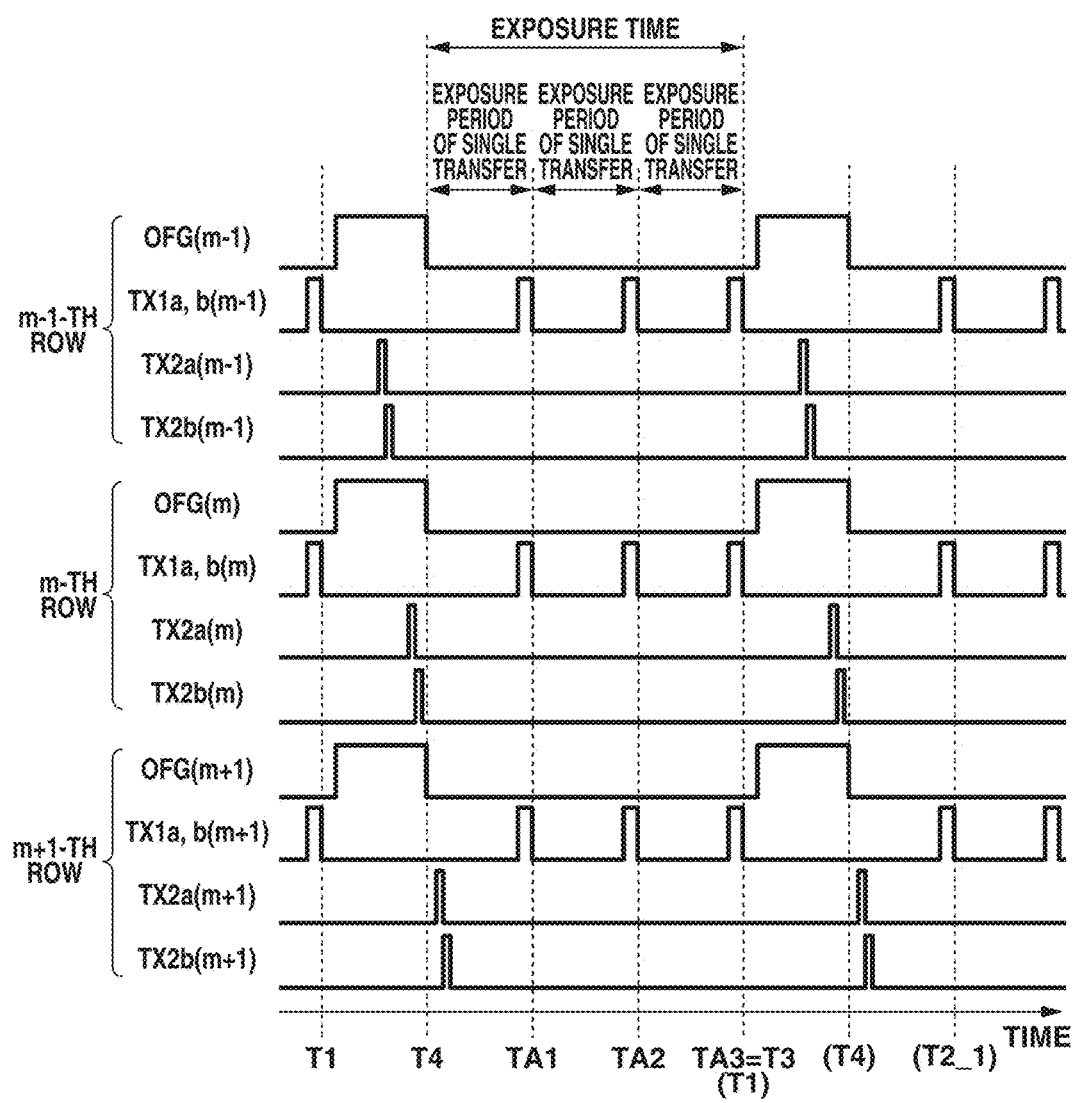
FIG. 17 is a diagram illustrating driving pulses of the imaging device.

A method for driving the imaging device according to the present exemplary embodiment is described. FIG. 17 schematically illustrates driving pulses used in the present exemplary embodiment. FIG. 17 illustrates driving pulses supplied to control lines Tx1a and Tx1b, control lines Tx2a and Tx2b, and the control line OFG of each pixel in m−1-th to m+1-th rows. The driving pulses supplied to the control lines Tx2a and Tx2b are similar to those of the third exemplary embodiment illustrated in FIG. 14.

When a driving pulse is at a high level, the corresponding transistor or switch is turned on. When a driving pulse is at a low level, the corresponding transistor or switch is turned off. These driving pulses are supplied from a control unit disposed in the imaging device. As the control unit, a logic circuit such as a shift register or an address decoder is used.

In FIG. 17, at a time T4, the discharge switches 18a and 18b are controlled to shift from an on-state to off-state. While the discharge switches 18a and 18b are on, generated electric charges are discharged. Thus, according to the driving in FIG. 17, the exposure period is from the time T4 to a time T3. In this exposure period, the control lines Tx1a and Tx1b are driven a plurality of times, thereby sequentially transferring electric charges in the photoelectric conversion portions 1a and 1b to the holding portions 2a and 2b, respectively. Exposure periods are from the time T4 to a time TA1, from the time TA1 to a time TA2, and from the time TA2 to a time TA3. The time TA3 and the time T3 are the same time. To reduce the unevenness of accumulation during the exposure periods, it is desirable to set approximately equal periods. Further, to shorten the exposure periods, the time T4 may be set to, for example, the second period described in the third exemplary embodiment.

According to the present exemplary embodiment, it is possible to change the driving method according to the brightness of an object. For example, typically, the driving pulses in FIG. 13 can be used. When the object is bright, the driving pulses in FIG. 17 can be used. When the object is brighter, driving pulses obtained by setting the time T4 in FIG. 17 to a later time can be used.

In FIG. 17, at the time T4, the photoelectric conversion portions 1a and 1b start accumulating electric charges. Then, from the time T4 to the time T3, the discharge switches 18a and 18b are maintained in the off-states. Further, a reading operation is performed based on the driving pulses illustrated in FIG. 5.

As described above, according to the present exemplary embodiment, it is possible to arbitrarily set an exposure period in addition to the effect of the third exemplary embodiment.

A fifth exemplary embodiment is described. The present exemplary embodiment is different from the fourth exemplary embodiment in the circuit configuration of a pixel. Therefore, only the differences from the fourth exemplary embodiment are described, and portions similar to those of the fourth exemplary embodiment are not described here.

Figure 18:
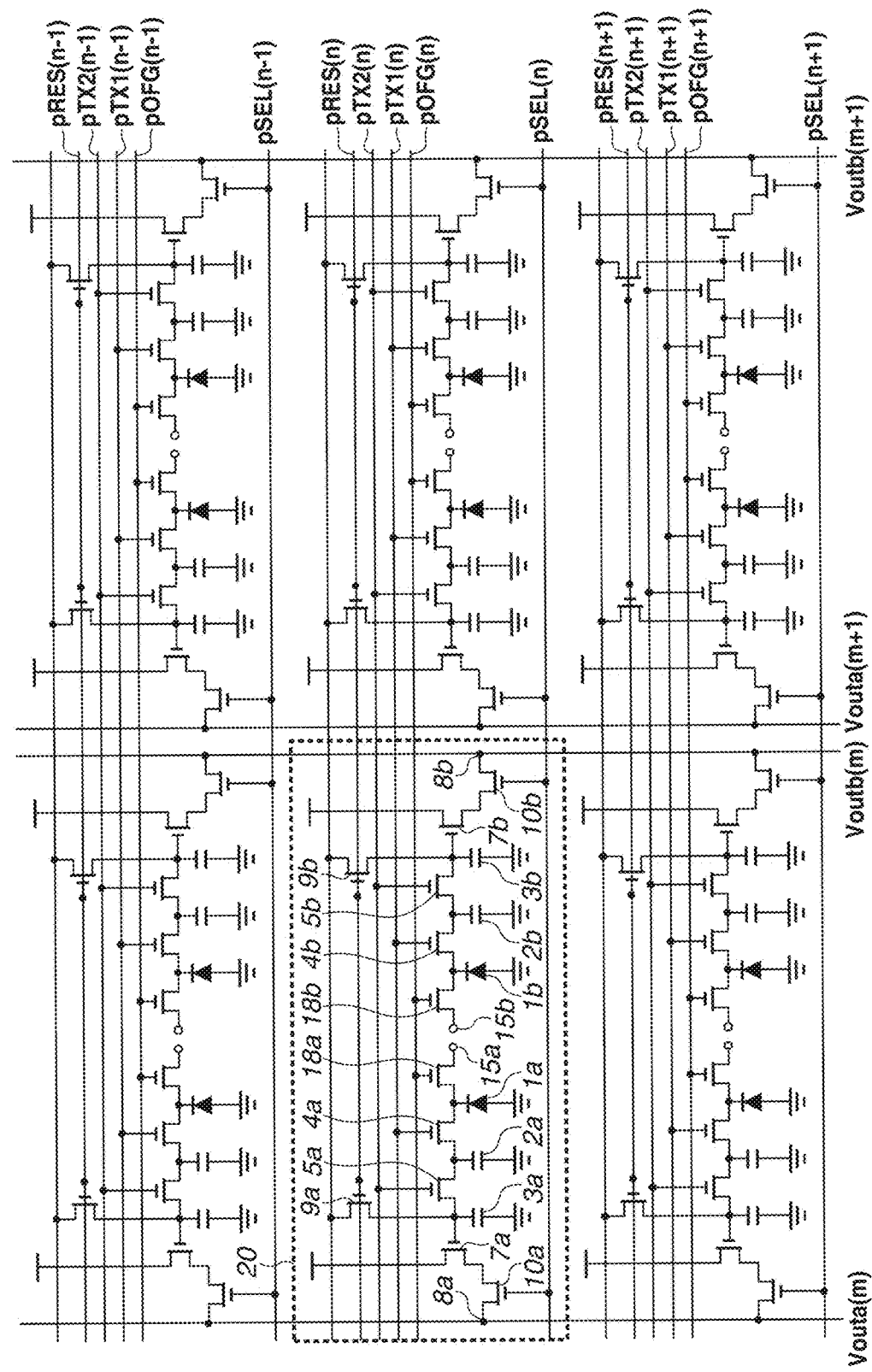
FIG. 18 is a diagram illustrating an equivalent circuit of pixels of an imaging device.

FIG. 18 illustrates an equivalent circuit according to the present exemplary embodiment. In FIG. 15 of the fourth exemplary embodiment, the input node 3 of the amplification unit 10 and the subsequent members are shared by the two second transfer transistors 5a and 5b. Therefore, a single amplification unit 10 receives electric charges from a plurality of accumulation regions. On the other hand, in the present exemplary embodiment, the amplification unit 10 includes a plurality of amplification transistors corresponding to a plurality of accumulation regions.

In the configuration of FIG. 15, the input node 3 of the amplification unit 10 is shared. Therefore, it is necessary to sequentially read accumulated electric charges in the holding portions 2a and 2b as illustrated in FIG. 14. Thus, the configuration of FIG. 18 is employed, whereby the input node 3 and the subsequent members have individual configurations. Accordingly, it is possible to individually read accumulated electric charges in the holding portions 2a and 2b as illustrated in FIG. 5 of the first exemplary embodiment. As a result, it is possible to shorten the reading period, i.e., the first period. The first period is shortened, thereby shortening the period during which the photoelectric conversion portions 1a and 1b alone need to accumulate electric charges. Thus, it is possible to make the amounts of saturation charge of the photoelectric conversion portions 1a and 1b small and optimize the areas of the photoelectric conversion portions 1a and 1b and the holding portions 2a and 2b.

Figure 19:
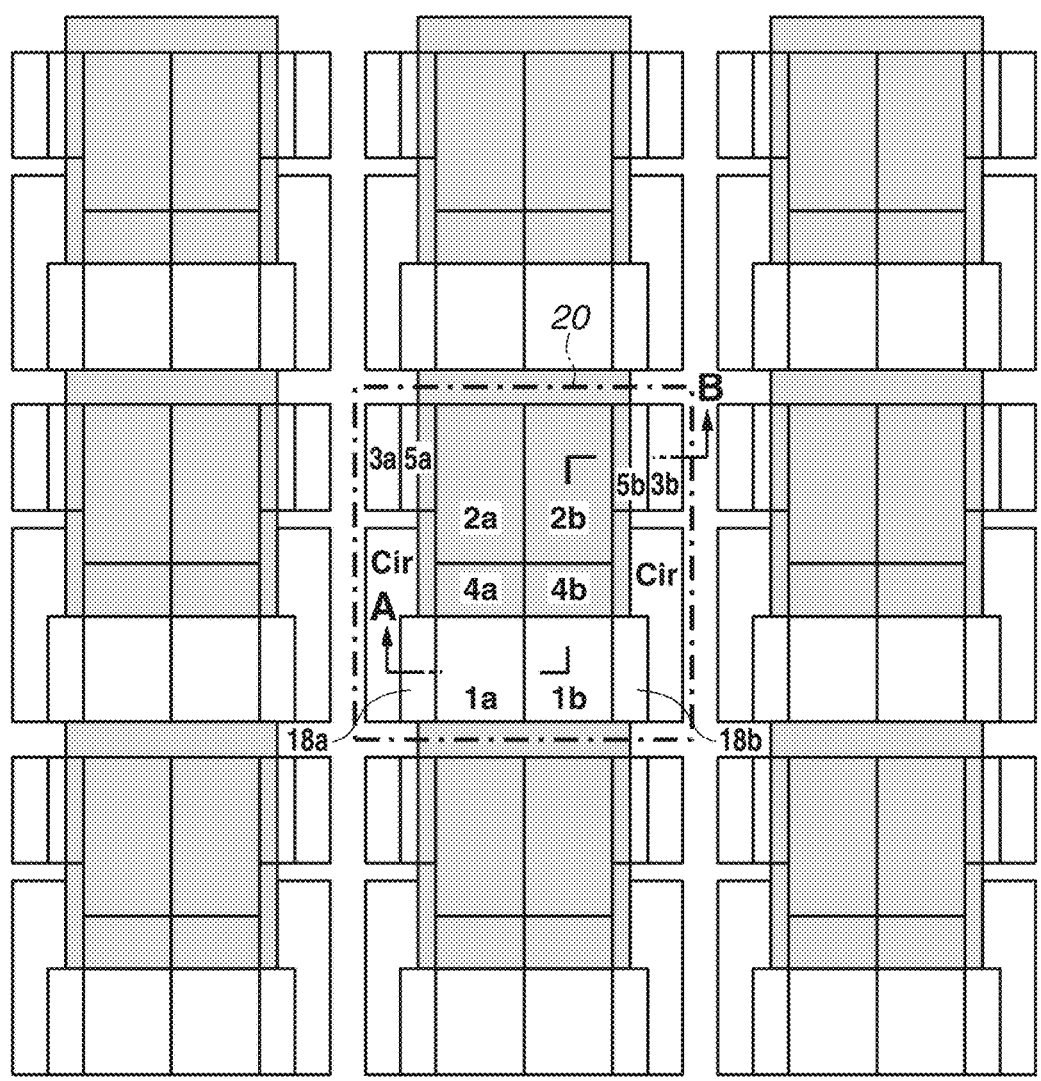
FIG. 19 is a diagram schematically illustrating an upper surface structure of pixels of the imaging device.

FIG. 19 illustrates a top view of pixels according to the present exemplary embodiment. FIG. 19 is different from FIG. 16 of the fourth exemplary embodiment in that the discharge switches 18a and 18b are not arranged between the photoelectric conversion portions 1a and 1b, but are arranged symmetrically with respect to a separation region. Since overflow drains 15 are formed separately from each other, there is an advantage that it is easy to independently control discharge. It is a matter of course that even if a configuration similar to that in FIG. 16 is employed, the operation illustrated in the present exemplary embodiment is similarly performed. Thus, it is possible to select an appropriate configuration.

A driving method according to the present exemplary embodiment is similar to those according to the third and fourth exemplary embodiments. More specifically, if discharge switches are not included, the driving pulses and the operations illustrated in FIGS. 13 and 6 are used. If discharge switches are included, the driving pulses and the operations illustrated in FIGS. 17 and 9 are used. A detailed description is similar to those in the third and fourth exemplary embodiments and therefore is omitted.

As described above, according to the present exemplary embodiment, it is possible to speed up the driving of an imaging device in addition to the effect of the fourth exemplary embodiment. Further, it is possible to optimize the areas of the photoelectric conversion portions 1a and 1b and holding portions 2a and 2b.

A sixth exemplary embodiment is described. The present exemplary embodiment is different from the first to fifth exemplary embodiments in the driving method. Therefore, only the differences from the first to fifth exemplary embodiments are described, and portions similar to those of any of the first to fifth exemplary embodiments are not described here.

An equivalent circuit of pixels of the present exemplary embodiment is similar to that of any of the first to fifth exemplary embodiments. In other words, any of FIGS. 1, 7, 10, 15, and 18 illustrates an equivalent circuit of pixels of an imaging device according to the present exemplary embodiment. The descriptions of these figures have been already made above in the first to fifth exemplary embodiments and therefore are omitted.

A cross-sectional structure of a pixel of the present exemplary embodiment is also similar to that of any of the first to fifth exemplary embodiments. In other words, any of FIGS. 2A, 2B, 2C, and 11 schematically illustrates a cross-sectional structure of a pixel of the present exemplary embodiment. The descriptions of these figures have been already made above in the first to fifth exemplary embodiments and therefore are omitted.

Figure 20:
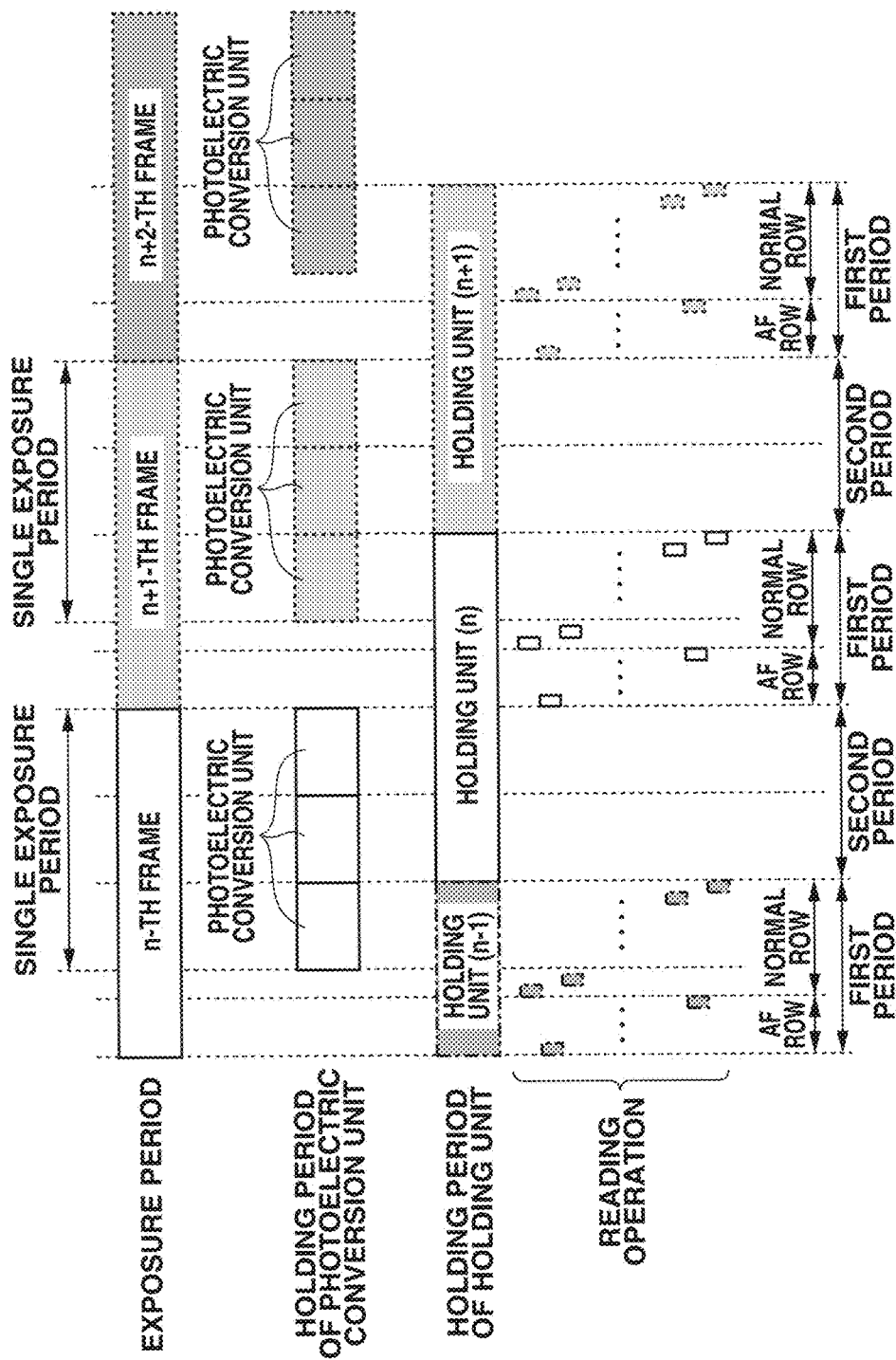
FIG. 20 is a diagram schematically illustrating an operation of the imaging device.

The operation of the imaging device according to the present exemplary embodiment is described. FIG. 20 schematically illustrates an operation used in the present exemplary embodiment. FIG. 20 is different from FIGS. 6 and 9 of the first to fifth exemplary embodiments in the operation of reading rows, i.e., the operation in the first period. FIG. 20 illustrates an operation of reading pixel signals of any row first, which is a row including pixel signals for phase difference detection in this case, and then reading pixel signals of the other rows. With such an operation, the pixel signals used for phase difference detection are output before the reading of the pixel signals of all the rows is finished. Therefore, it is possible to perform the processing of phase difference detection earlier. As a result, it is possible to perform phase difference detection at a higher speed.

In FIG. 20, the row used for phase difference detection read out first is skipped in the reading of the subsequent other rows, but may be sequentially read out again. In this case, pixel signals are output sequentially from the rows. As a result, it is possible to eliminate the need for a memory for holding a signal read earlier at a subsequent stage.

Detailed driving pulses are similar to those in any of the first to fifth exemplary embodiments and therefore are not described here. If a pixel does not include a discharge switch 18, a driving pulse supplied to the control line OFG is not necessary.

As described above, according to the present exemplary embodiment, it is possible to perform phase difference detection at a higher speed in addition to the effect of the first to fifth exemplary embodiments.

Figure 21:
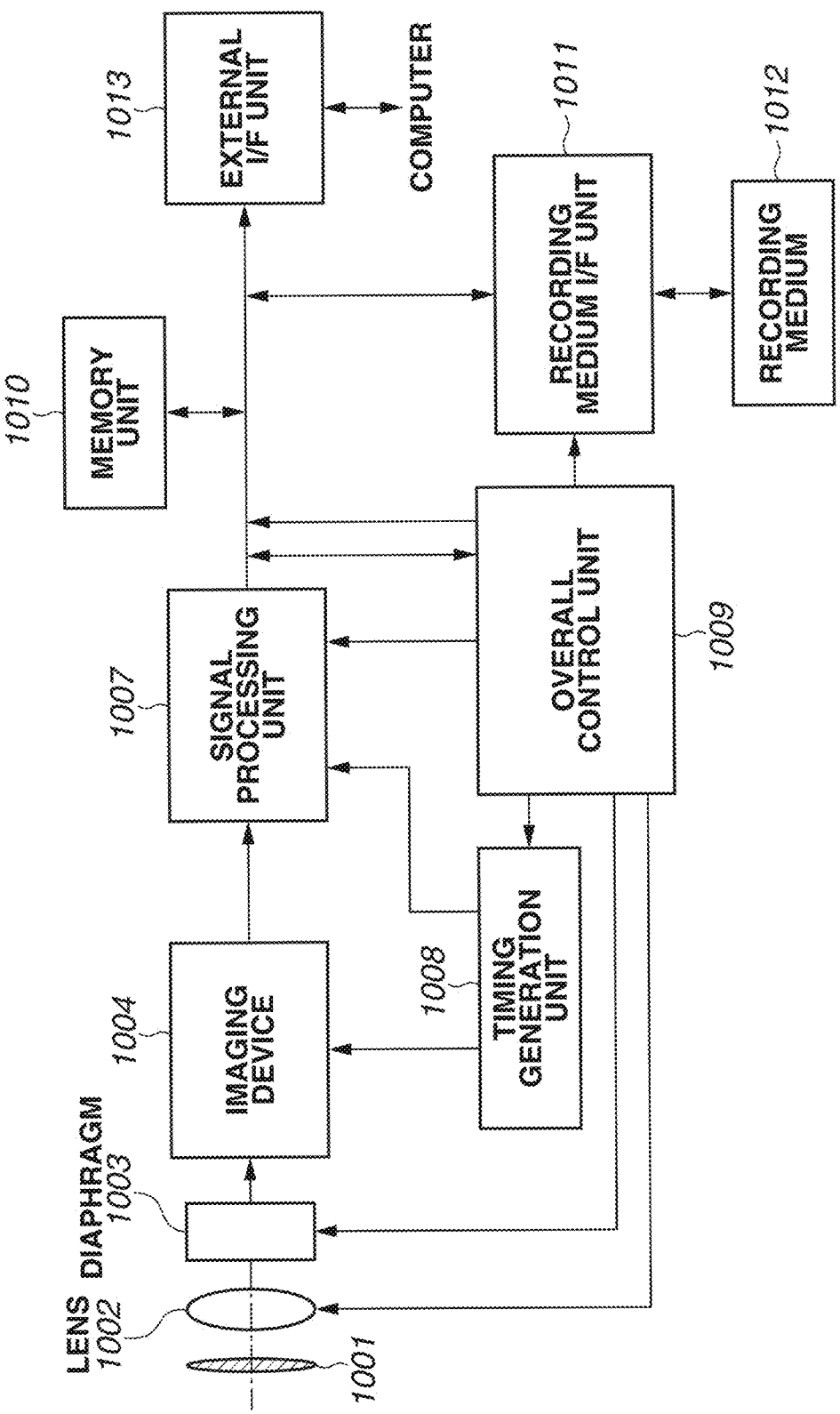
FIG. 21 is a block diagram illustrating a configuration of an imaging system.

An exemplary embodiment of an imaging system according to the present invention is described. Examples of the imaging system include a digital still camera, a digital camcorder, a copying machine, a fax, a mobile phone, an in-car camera, and an observation satellite. Further, a camera module including an optical system such as a lens and an imaging device is also included in the imaging system. FIG. 21 illustrates a block diagram of a digital still camera as an example of the imaging system.

In FIG. 21, a barrier 1001 protects a lens. A lens 1002 forms an optical image of an object on an imaging device 1004. A diaphragm 1003 varies the amount of light passing through the lens 1002. The imaging device 1004 is the imaging device described in each of the above exemplary embodiments and converts the optical image formed by the lens 1002 into image data. At this time, it is assumed that an AD conversion unit is formed on a semiconductor substrate of the imaging device 1004. A signal processing unit 1007 makes various corrections on captured data output from the imaging device 1004 and compresses data. Then, in FIG. 21, a timing generation unit 1008 outputs various timing signals to the imaging device 1004 and the signal processing unit 1007. An overall control unit 1009 controls the entire digital still camera. A frame memory unit 1010 temporarily stores image data. An interface unit 1011 is an interface for recording or reading data into or from a recording medium. An attachable and detachable recording medium 1012 such as a semiconductor memory is used to record or read captured data therein or therefrom. Then, an interface unit 1013 is an interface used to communicate with an external computer. In the present exemplary embodiment, a timing signal may be input from outside the imaging system. The imaging system may only need to include at least the imaging device 1004 and the signal processing unit 1007 for processing an imaging signal output from the imaging device 1004.

In the present exemplary embodiment, the configuration has been described in which the imaging device 1004 and the AD conversion unit are formed on the same semiconductor substrate. Alternatively, the imaging device 1004 and the AD conversion unit may be provided on different semiconductor substrates. Yet alternatively, the imaging device 1004 and the signal processing unit 1007 may be formed on the same semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-180064, filed Sep. 11, 2015, which is hereby incorporated by reference herein in its entirety.

What is claimed is:

1. An imaging device comprising:
a plurality of pixels each including a photoelectric conversion portion configured to accumulate an electric charge generated with incident light, a holding unit configured to hold the electric charge, an amplification unit configured to output a signal based on the electric charge, a first transfer switch configured to transfer the electric charge from the photoelectric conversion portion to the holding unit, and a second transfer switch configured to transfer the electric charge from the holding unit to the amplification unit;
an output line to which signals from the amplification units of the plurality of pixels are output, and
a control unit,
wherein the photoelectric conversion portion of each of at least some pixels of the plurality of pixels includes a plurality of accumulation regions electrically isolated from each other, and
wherein the control unit is configured to control the plurality of pixels such that:
at a first time, the photoelectric conversion portions of the plurality of pixels start accumulating the electric charge,
from the first time to a second time, the first transfer switch of at least one pixel of the plurality of pixels is maintained in an off-state, and the photoelectric conversion portion of the at least one pixel accumulates an electric charge generated during a first period from the first time to the second time,
in the first period, the second transfer switches of the plurality of pixels are turned on in turns, and the amplification units of the plurality of pixels output signals in turns,
during at least a part of a second period from the second time to a third time, the holding unit of each of the plurality of pixels holds an electric charge generated during the first period in the photoelectric conversion portion and an electric charge generated during the second period in the photoelectric conversion portion, and
at the third time, the first transfer switches of the plurality of pixels are controlled to shift from an on-state to an off-state.

2. The imaging device according to claim 1, wherein the first transfer switch of each of the at least some pixels includes a plurality of first transfer transistors disposed to correspond to the plurality of accumulation regions.

3. The imaging device according to claim 2, wherein the control unit is configured to control the plurality of pixels such that the plurality of first transfer transistors operate in a same phase.

4. The imaging device according to claim 1, wherein the holding unit of each of the at least some pixels includes a plurality of holding regions corresponding to the plurality of accumulation regions, the plurality of holding regions being electrically isolated from each other.

5. The imaging device according to claim 4, wherein the second transfer switch of each of the at least some pixels includes a plurality of second transfer transistors corresponding to the plurality of holding regions.

6. The imaging device according to claim 5, wherein the plurality of second transfer transistors are controlled independently of each other.

7. The imaging device according to claim 1, wherein the amplification unit of each of the at least some pixels includes an amplification transistor configured to receive electric charges from the plurality of accumulation regions.

8. The imaging device according to claim 1, wherein the amplification unit of each of the at least some pixels includes a plurality of amplification transistors, each configured to receive an electric charge from a corresponding one of the plurality of accumulation regions.

9. The imaging device according to claim 1,
wherein the at least some pixels include a first pixel and a second pixel,
wherein the plurality of accumulation regions of the first pixel are arranged along a first direction, and
wherein the plurality of accumulation regions of the second pixel are arranged along a second direction intersecting the first direction.

10. The imaging device according to claim 1, wherein an amount of saturation charge of the holding unit is larger than an amount of saturation charge of the photoelectric conversion portion.

11. The imaging device according to claim 1, wherein control unit is configured to control the plurality of pixels such that, during at least a part of the second period, the first transfer switch is controlled to be turned off.

12. An imaging device comprising:
a plurality of pixels, each including a photoelectric conversion portion configured to accumulate an electric charge generated by incident light, a holding unit configured to hold the electric charge, an amplification unit configured to output a signal based on the electric charge, a first transfer switch configured to transfer the electric charge from the photoelectric conversion portion to the holding unit, and a second transfer switch configured to transfer the electric charge from the holding unit to the amplification unit;
an output line to which signals from the amplification units of the plurality of pixels are output, and
a control unit,
wherein each of at least some pixels of the plurality of pixels outputs a signal for focus detection by an image plane phase difference method, and
wherein the control unit is configured to control the plurality of pixels such that:
at a first time, the photoelectric conversion portions of the plurality of pixels starts accumulating the electric charge,
from the first time to a second time, the first transfer switch of at least one pixel of the plurality of pixels is maintained in an off-state, and the photoelectric conversion portion of the at least one pixel accumulates an electric charge generated during a first period from the first time to the second time,
during the first period, the second transfer switches of the plurality of pixels are turned on in turns, and the amplification units of the plurality of pixels output signals in turns,
during at least a part of a second period from the second time to a third time, the holding unit of each of the plurality of pixels holds an electric charge generated during the first period in the photoelectric conversion portion and an electric charge generated during the second period in the photoelectric conversion portion, and
at the third time, the first transfer switches of the plurality of pixels are controlled to shift from an on-state to an off-state
wherein each of at least some pixels of the plurality of pixels outputs a signal for focus detection by an image plane phase difference method.

13. The imaging device according to claim 12, wherein an amount of saturation charge of the holding unit is larger than an amount of saturation charge of the photoelectric conversion portion.

14. The imaging device according to claim 13, wherein during at least a part of the second period, the first transfer switch is controlled to be turned off.

15. An imaging system comprising:
the imaging device according to claim 12;
an optical system; and
a signal processing device configured to process a signal from the imaging device,
wherein a focus state of the optical system is controlled based on the signal from the imaging device.

16. A method for operating the imaging device according to claim 12, comprising the steps that:
at a first time, the photoelectric conversion portions of the plurality of pixels starts accumulating the electric charge,
from the first time to a second time, the first transfer switch of at least one pixel of the plurality of pixels is maintained in an off-state, and the photoelectric conversion portion of the at least one pixel accumulates an electric charge generated during a first period from the first time to the second time,
during the first period, the second transfer switches of the plurality of pixels are turned on in turns, and the amplification units of the plurality of pixels output signals in turns,
during at least a part of a second period from the second time to a third time, the holding unit of each of the plurality of pixels holds an electric charge generated during the first period in the photoelectric conversion portion and an electric charge generated during the second period in the photoelectric conversion portion, and
at the third time, the first transfer switches of the plurality of pixels are controlled to shift from an on-state to an off-state.

* * * * *